US012757475B2

(12) United States Patent
Chiu et al.

(10) Patent No.: US 12,757,475 B2
(45) Date of Patent: Oct. 6, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Wen-Li Chiu, Kaohsiung City (TW); Chia-Hao Kuo, Taoyuan City (TW); Fu-Hsiang Su, Hsinchu (TW); Shih-Hsun Chang, Hsinchu (TW)

(73) Assignee: Taiwan Semiconductor Manfacturing Company, Ltd., Hsinchu (TW)

( * ) Notice: Subject to any disclaimer, the term of this patent is extended or adjusted under 35 U.S.C. 154(b) by 340 days.

(21) Appl. No.: 18/644,036

(22) Filed: Apr. 23, 2024

(65) Prior Publication Data

US 2025/0331285 A1 Oct. 23, 2025

(51) Int. Cl.

| | |
|---|---|
| ***H10D 84/01*** | (2026.01) |
| ***H10D 64/01*** | (2025.01) |
| ***H10D 84/83*** | (2025.01) |
| ***H10W 10/00*** | (2026.01) |
| ***H10W 10/17*** | (2026.01) |
| ***H10W 10/20*** | (2026.01) |

(52) U.S. Cl.

CPC ....... *H10D 84/0153* (2025.01); *H10D 64/017* (2025.01); *H10D 84/832* (2025.01); *H10W 10/014* (2026.01); *H10W 10/021* (2026.01); *H10W 10/17* (2026.01); *H10W 10/20* (2026.01)

(58) Field of Classification Search

CPC ........... H10D 84/0153; H10D 84/0188; H10D 84/0151; H10D 84/0135; H10D 84/0172; H10D 84/832; H10D 84/851; H10D 64/017; H10D 10/014–0148; H10D 10/17; H10D 10/021; H10D 10/20; H10D 30/6735

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |

(Continued)

*Primary Examiner* — Yu Chen
(74) *Attorney, Agent, or Firm* — JCIPRNET

(57) ABSTRACT

A semiconductor device includes a semiconductor substrate, a first device, a second device, and a composite isolation structure. The first device includes a first fin structure and a first gate structure. The first fin structure is disposed over the semiconductor substrate and includes a first channel region. The first gate structure wraps around the first channel region. The second device includes a second fin structure and a second gate structure. The second fin structure is disposed over the semiconductor substrate and includes a second channel region. The second gate structure wraps around the second channel region. The composite isolation structure is disposed between the first and second devices and includes first and second dielectric layers. The second dielectric layer is sandwiched between the semiconductor substrate and the first dielectric layer. A topmost surface of the second dielectric layer is lower than a bottom surface of the first channel region.

20 Claims, 32 Drawing Sheets

(56) References Cited

U.S. PATENT DOCUMENTS

| | | | | |
|---|---|---|---|---|
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2017/0243790 | A1* | 8/2017 | Xie | H10D 84/0158 |
| 2019/0131297 | A1* | 5/2019 | Chen | H10D 84/834 |
| 2019/0393324 | A1* | 12/2019 | Chen | H10D 64/017 |
| 2021/0183855 | A1* | 6/2021 | Ng | H10D 62/121 |
| 2021/0233906 | A1* | 7/2021 | Chen | H10D 84/834 |
| 2023/0139399 | A1* | 5/2023 | Zhou | H10D 30/795<br>257/506 |
| 2025/0014946 | A1* | 1/2025 | Chien | H10D 84/0158 |

* cited by examiner

SEMICONDUCTOR DEVICE AND MANUFACTURING METHOD THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, various methods have been developed to form isolation structures to divide active regions into segments. While existing isolation structures are generally adequate in isolating active region segments, they are not satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1A:
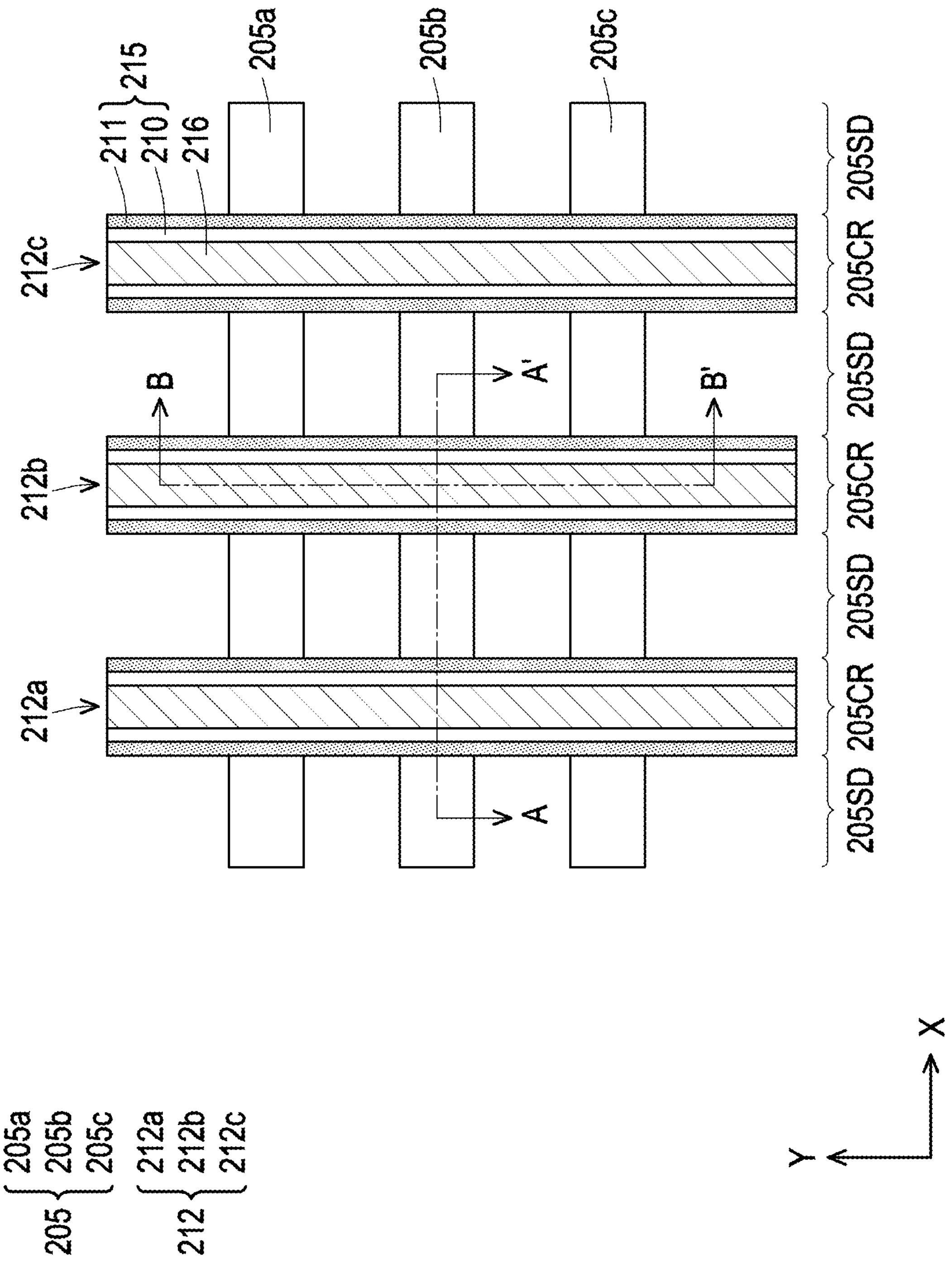
FIG. 1A to FIG. 1K are simplified top views illustrating various stages of a method of manufacturing a semiconductor structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Continuous poly on diffusion edge (CPODE) processes have been developed to form isolation structures (may be referred to as CPODE structures or dielectric gates) to divide active regions into segments. CPODE structures and other similar structures are a scaling tool to improve density of devices (e.g., transistors). To achieve desired scaling effect while maintaining the devices' proper functions (e.g., avoiding electrical shorting), the CPODE structures may be formed between boundaries of such devices (i.e., between, for example, S/D contacts formed subsequently over the epitaxial S/D features), such that the separation distance between adjacent devices may be reduced or minimized without compromising device performance.

FIG. 1A to FIG. 1K are simplified top views illustrating various stages of a method of manufacturing a semiconductor device 200 in accordance with some embodiments of the disclosure. FIG. 2A to FIG. 2K are respectively cross-sectional views of the semiconductor device 200 taken along line A-A' in FIG. 1A to FIG. 1K. FIG. 3A to FIG. 3K are respectively cross-sectional views of the semiconductor device 200 taken along line B-B' in FIG. 1A to FIG. 1K. For simplicity and clarity, some elements shown in the cross-sectional views of FIG. 2A to FIG. 2K and FIG. 3A to FIG. 3K are omitted in the top views of FIG. 1A to FIG. 1K.

Figure 3A:
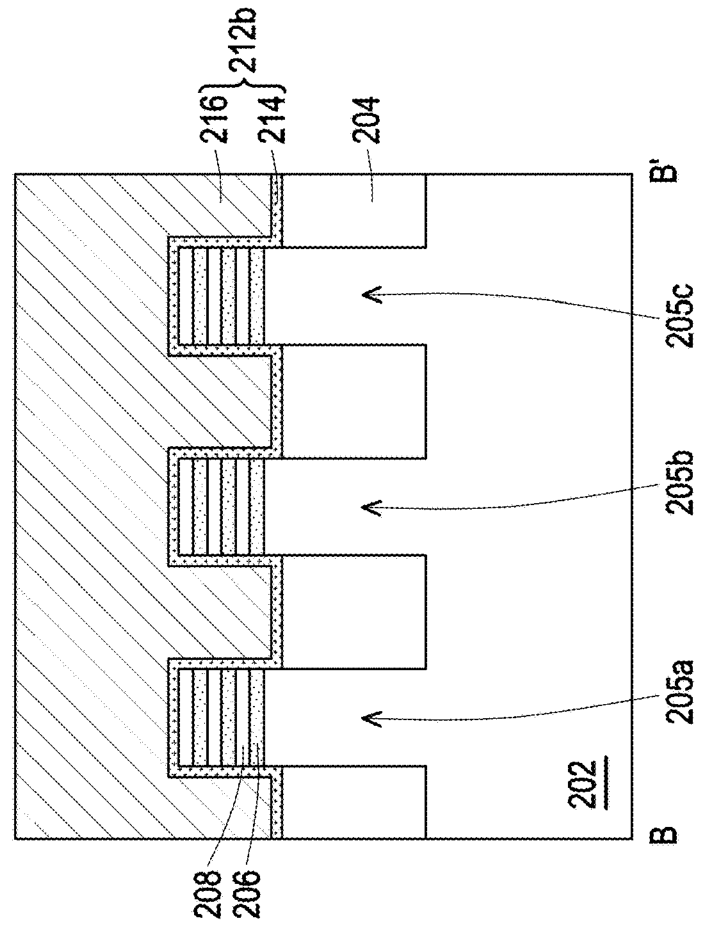
FIG. 3A to FIG. 3K are cross-sectional views illustrating various stages of the method of manufacturing the semiconductor structure in FIG. 1A to FIG. 1K.
Figure 2A:
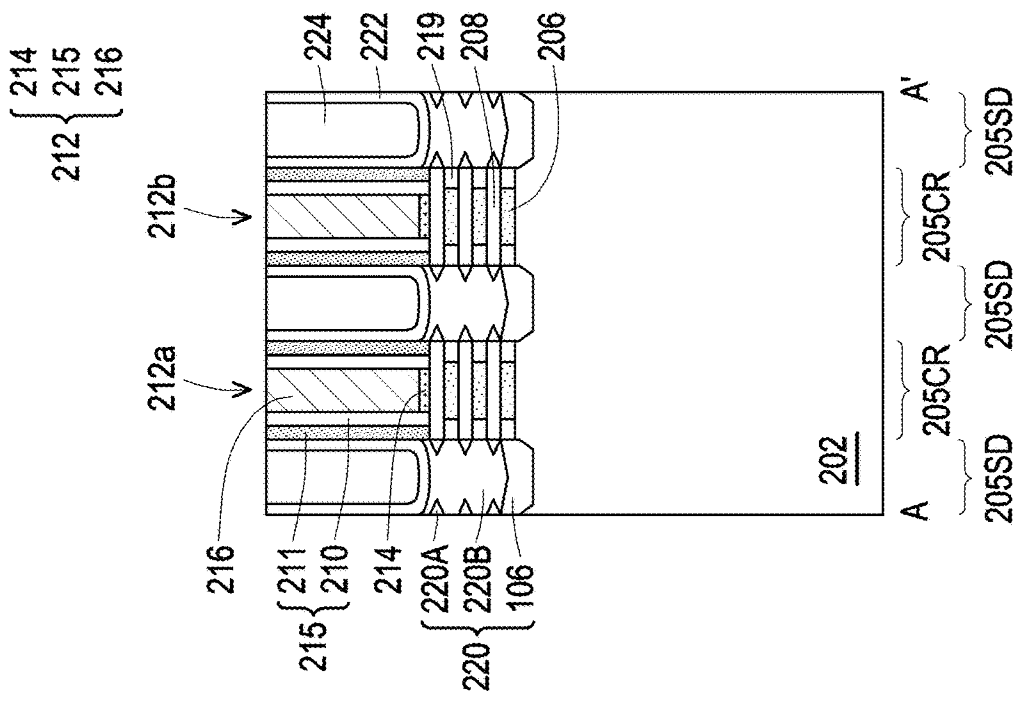
FIG. 2A to FIG. 2K are cross-sectional views illustrating various stages of the method of manufacturing the semiconductor structure in FIG. 1A to FIG. 1K.

Referring to FIG. 1A, FIG. 2A, and FIG. 3A, a semiconductor substrate 202 (shown in FIG. 2A and FIG. 3A) is provided. In some embodiments, the semiconductor substrate 202 is a bulk silicon substrate (i.e., including bulk single-crystalline silicon). The semiconductor substrate 202 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof.

In some alternative embodiments, the semiconductor substrate 202 may be a semiconductor-on-insulator substrate, such as a silicon-on-insulator (SOI) substrate, a silicon germanium-on-insulator (SGOI) substrate, or a germanium-on-insulator (GOI) substrate, and includes a carrier, an insulator on the carrier, and a semiconductor layer on the insulator.

In some embodiments, a plurality of fin structures 205 is formed on the semiconductor substrate 202. As illustrated in FIG. 1A, the fin structures 205 extend along an X direction. In some embodiments, the fin structures 205 includes a fin structures 205*a*, a fin structure 205*b*, and a fin structure 205*c* arranged in parallel. As illustrated in FIG. 1A and FIG. 3A, the fin structure 205*b* is disposed between the fin structure 205*a* and the fin structure 205*c* in a Y direction. The fin structures 205 may be formed from a portion of the semiconductor substrate 202 and a vertical stack of alternating semiconductor layers. In some embodiments, a vertical stack of alternating semiconductor layers includes a number of channel layers 208 interleaved by a number of sacrificial layers 206. Each channel layer 208 may include a semiconductor material such as, silicon, germanium, silicon carbide, silicon germanium, GeSn, SiGeSn, SiGeCSn, other suitable semiconductor materials, or combinations thereof, while each sacrificial layer 206 has a composition different from that of the channel layer 208. In some embodiments, the channel layer 208 includes silicon (Si) and the sacrificial layer 206 includes silicon germanium (SiGe). The channel layers 208 and the sacrificial layers 206 may be epitaxially deposited on the semiconductor substrate 202 using molecular beam epitaxy (MBE), vapor-phase epitaxy (VPE), ultra-high vacuum CVD (UHV-CVD), and/or other suitable epitaxial growth processes. In some embodiments, each fin structure 205 may include a total of three to ten pairs of alternating sacrificial layers 206 and channel layers 208; of course, other configurations may also be applicable depending upon specific design requirements. In some alternative embodiments when fin-type field effect transistors (FinFETs) are desired, each fin structure 205 may include a uniform semiconductor composition and free of the vertical stack as depicted herein.

As illustrated in FIG. 1A, FIG. 2A, and FIG. 3A, a plurality of dummy gate structures 212 are disposed over channel regions 205CR of the fin structures 205. In some embodiments, the dummy gate structures 212 include a dummy gate structure 212*a*, a dummy gate structure 212*b*, and a dummy gate structure 212*c* arranged in parallel. For example, the dummy gate structure 212*a*, the dummy gate structure 212*b*, and the dummy gate structure 212*c* extend along the Y direction, and the dummy gate structure 212*b* is disposed between the dummy gate structure 212*a* and the dummy gate structure 212*c* in the X direction. As illustrated in FIG. 1A, the dummy gate structures 212 are perpendicular to the fin structures 205. That is, the dummy gate structures 212 are formed across the fin structures 205. In some embodiments, the dummy gate structures 212*a*-212*c* may share substantially the same composition and dimension. In some embodiments, each fin structure 205 includes channel regions 205CR and source/drain regions 205SD, as shown in FIG. 2A. For example, overlapping regions between the dummy gate structures 212 and the fin structures 205 are the channel regions 205CR while the non-overlapping regions between the dummy gate structures 212 and the fin structures 205 are source/drain regions 205SD. As illustrated in FIG. 1A and FIG. 2A, each of the channel regions 205CR is disposed between two adjacent source/drain regions 205SD along the X direction. Although three dummy gate structures 212*a*-212*c* are shown in FIG. 1A, it should be understood that the number of the dummy gate structures are not limited herein. In some alternative embodiments, more dummy gate structures or less dummy gate structures may be present. In some embodiments, a gate replacement process (or gate-last process) may be performed in later steps, and the dummy gate structures 212*a*-212*c* may serve as placeholders for functional gate structures. It should be understood that other processes for forming the functional gate structures are possible.

In some embodiments, each dummy gate structure 212*a*-212*c* includes a dielectric layer 214 (e.g., silicon oxide), a dummy gate electrode 216 disposed over the dielectric layer 214, and a pair of spacers 215 aside the dummy gate electrode 216. In some embodiment, the dummy gate electrodes 216 include a silicon-containing material, such as poly-silicon, amorphous silicon or a combination thereof. The dummy gate electrodes 216 may be formed using a suitable process such as ALD (atomic layer deposition), CVD (chemical vapor deposition), PVD (physical vapor deposition), or combinations thereof. As will be discussed in detail below, at least portions of the dummy gate structures 212 are configured to be replaced with a gate structure 250 (shown in FIG. 2K), while at least a portion of the dummy gate structures 212 would be replaced with a composite isolation structure 260 (shown in FIG. 2K and FIG. 3K) to provide an isolation between neighboring active regions.

In some embodiments, each pair of spacers 215 covers sidewalls of the corresponding dummy gate electrode 216 and sidewalls of the corresponding dielectric layer 214. In some embodiments, the spacers 215 cover portions of the fin structures 205, as shown in FIG. 1A. In some embodiments, each pair of spacers 215 includes a pair of first spacers 210 and a pair of second spacers 211. In some embodiments, the first spacers 210 are sandwiched between the dummy gate electrode 216 and the second spacers 211. In some embodiments, a material of the first spacers 210 and a material of the second spacers 211 are different. For example, materials of the first spacers 210 and the second spacers 211 may respectively include SiN, SiCN, SiOCN, SiOR (wherein R is an alkyl group such as $CH_3$, $C_2H_5$, or $C_3H_7$), SiC, SiOC, SiON, a combination thereof, or the like.

As shown in FIG. 3A, a plurality of a shallow trench isolation (STI) regions 204 is formed between adjacent fin structures 205 to isolate these fin structures 205. That is, the STI regions 204 are sandwiched between two adjacent fin structures 205. For example, one of the STI region 204 is sandwiched between the fin structure 205*a* and the fin structure 205*b* while another one of the STI region 204 is sandwiched between the fin structure 205*b* and the fin structure 205*c*. In some embodiments, the STI region 204 may include silicon oxide, silicon oxynitride, fluorine-doped silicate glass (FSG), a low-k dielectric, combinations thereof, and/or other suitable materials.

As shown in FIG. 2A, a plurality of source/drain features 220 is formed in and/or over source/drain regions 205SD and is coupled to the channel layers 208 in the channel regions 205CR. Depending on the conductivity type of the to-be-formed transistor, the source/drain features 220 may be n-type source/drain features or p-type source/drain features. Exemplary n-type source/drain features may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. Exemplary p-type source/drain features may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process. In some embodiments, the source/drain features 220 comprise a first epitaxial layer 220A on the sidewalls of the channel layers 208, and a second epitaxial layer 220B on the first epitaxial layer 220A, as shown in FIG. 2A. The first epitaxial layer 220A and the second epitaxial layer 220B may be formed of different semiconductor materials and/or may be doped to different dopant concentrations. The first epitaxial layer 220A may be grown first, and the second epitaxial layer 220B may be grown on the first epitaxial layer 220A.

Optionally, each source/drain feature 220 also includes a semiconductor layer 106. The semiconductor layer 106 is formed under the first epitaxial layer 220A and the second epitaxial layer 220B. The semiconductor layer 106 may be formed of a semiconductor material selected from the candidate semiconductor materials of the semiconductor substrate 202, which may be grown by an epitaxial growth process such as vapor phase epitaxy (VPE), molecular beam epitaxy (MBE), or the like. The semiconductor layer 106 may be undoped semiconductor layers. In some embodiments, the semiconductor layer 106 is formed of undoped silicon or undoped silicon germanium. The semiconductor layer 106 may be provided to improve isolation between adjacent lower portion of the source/drain features 220, reducing leakage from the lower portion of the source/drain features 220 through the underlying fin structures 205 and/or the semiconductor substrate 202.

As shown in FIG. 2A, a plurality of inner spacer features 219 is disposed between two adjacent channel layers 208 and is in direct contact with sacrificial layers 206 in the channel regions 205CR. The inner spacer features 219 may include silicon nitride, silicon oxycarbonitride, silicon carbonitride, silicon oxide, silicon oxycarbide, silicon carbide, or silico oxynitride.

As shown in FIG. 2A, a contact etch stop layer (CESL) 222 and an interlayer dielectric (ILD) layer 224 are deposited over the source/drain regions 205SD. For example, the CESL 222 may be deposited on top surfaces of the source/drain features 220 and sidewalls of the second spacers 211. The CESL 222 is configured to protect various underlying components during subsequent fabrication processes and may include silicon nitride, silicon oxynitride, and/or other suitable materials and may be formed by ALD, CVD, plasma-enhanced chemical vapor deposition (PECVD) process and/or other suitable deposition or oxidation processes. The ILD layer 224 is deposited by a CVD process, a PECVD process or other suitable deposition technique after the deposition of the CESL 222. The ILD layer 224 may include silicon oxide, a low-k dielectric material, TEOS, doped silicon oxide (e.g., BPSG, FSG, PSG, BSG, etc.), other suitable dielectric materials, or combinations thereof. One or more chemical mechanical planarization (CMP) processes may be performed to planarize top surfaces of the CESL 222, the ILD layer 224, and the dummy gate structures 212.

Figure 1B:
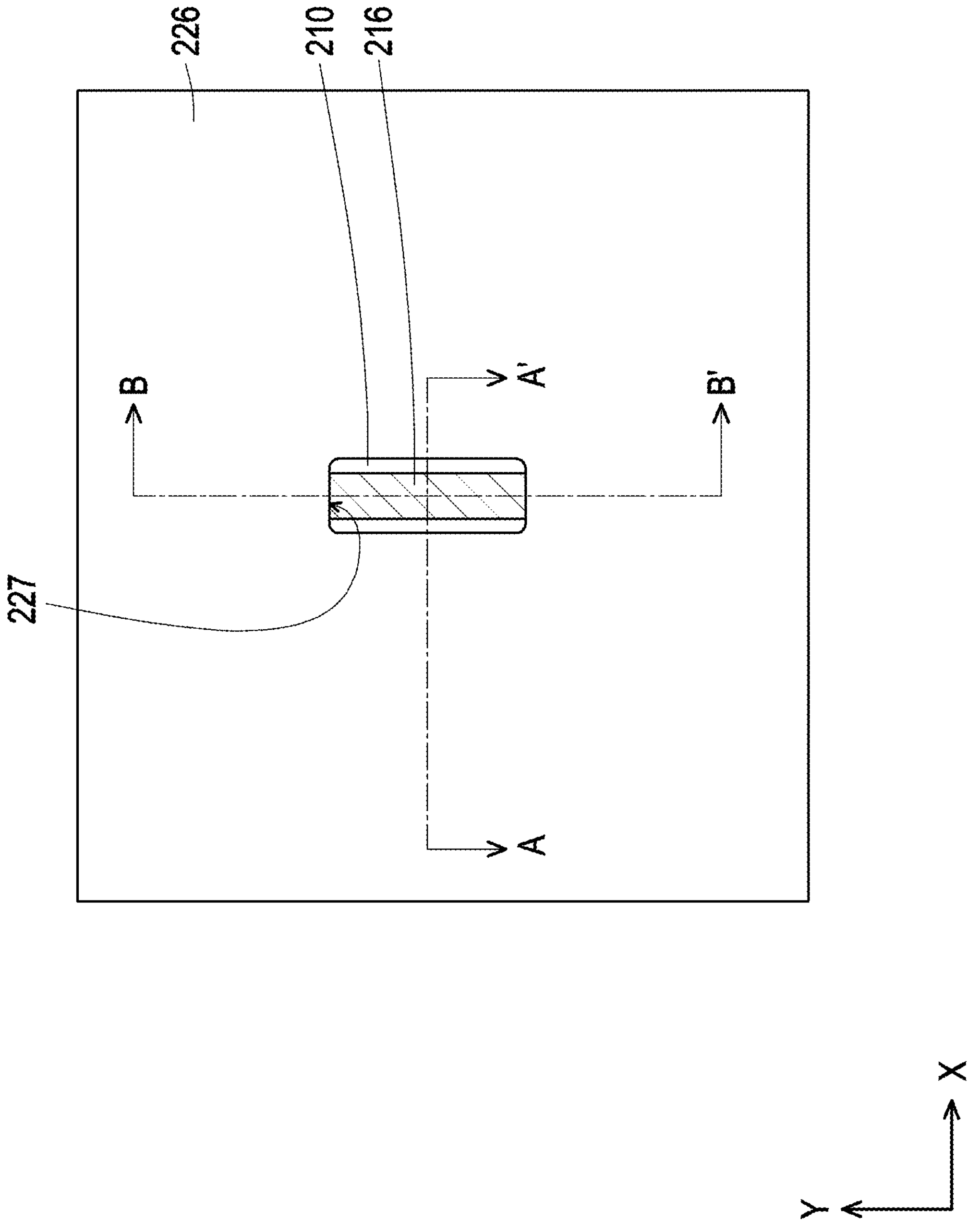
Figure 2B:
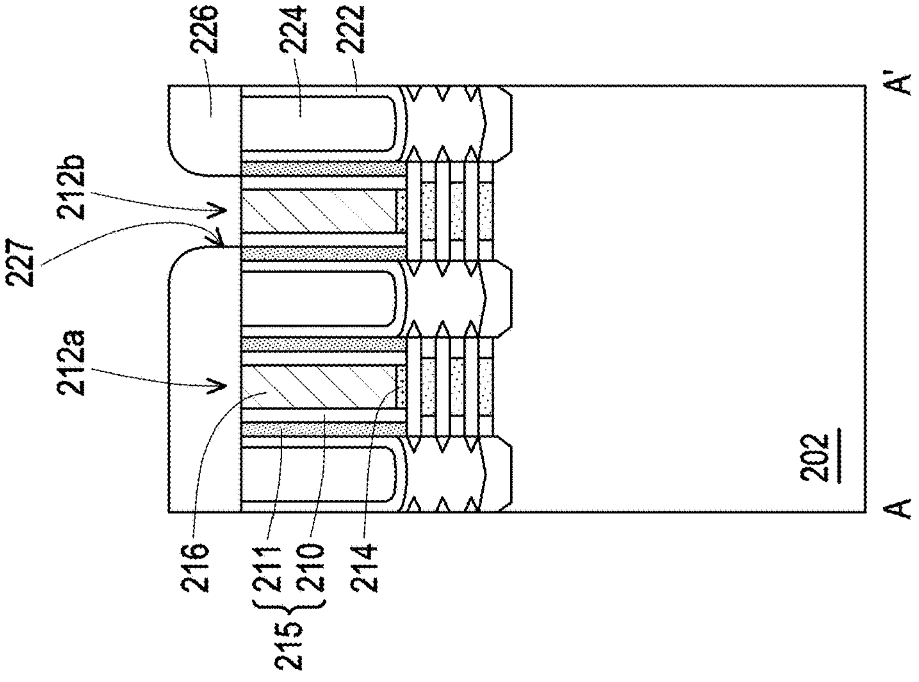
Figure 3B:
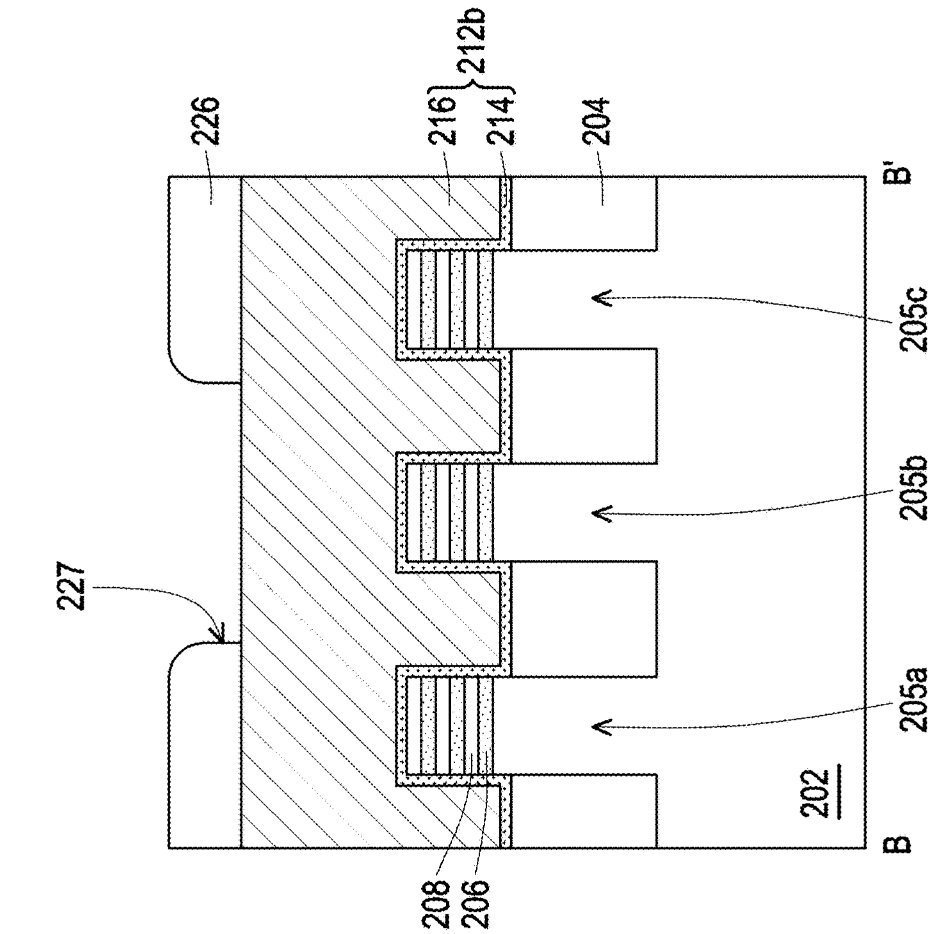

Referring to FIG. 1B, FIG. 2B, and FIG. 3B, a hard mask layer 226 is formed on the CESL 222, the ILD layer 224, and the dummy gate structures 212. Then, the hard mask layer 226 is patterned to form an opening 227 to expose a portion of the dummy gate structure 212*b*. The hard mask layer 226 may include aluminum oxide, silicon oxide, silicon nitride, silicon carbonitride, silicon oxycarbide, silicon oxynitride, silicon oxycarbonitride, other suitable materials, or combinations thereof, and may be formed by CVD, ALD, PVD, other suitable methods, or combinations thereof. In an embodiment, the hard mask layer 226 is formed to protect the ILD layer 224 from being damaged by the subsequently performed etching processes. In some embodiments, the hard mask layer 226 entirely covers an upper surface of the second spacers 211 of the dummy gate structure 212*b*, as shown in FIG. 2B and FIG. 3B. However, the disclosure is not limited thereto. In some alternative embodiments, the hard mask layer 226 partially covers the upper surface of the second spacers 211 or does not cover the upper surface of the second spacers 211 at all. In some embodiments, the opening 227 exposes a portion of the dummy gate electrode 216 and a portion of the first spacers 210 of the dummy gate structure 212*b*.

Figure 1C:
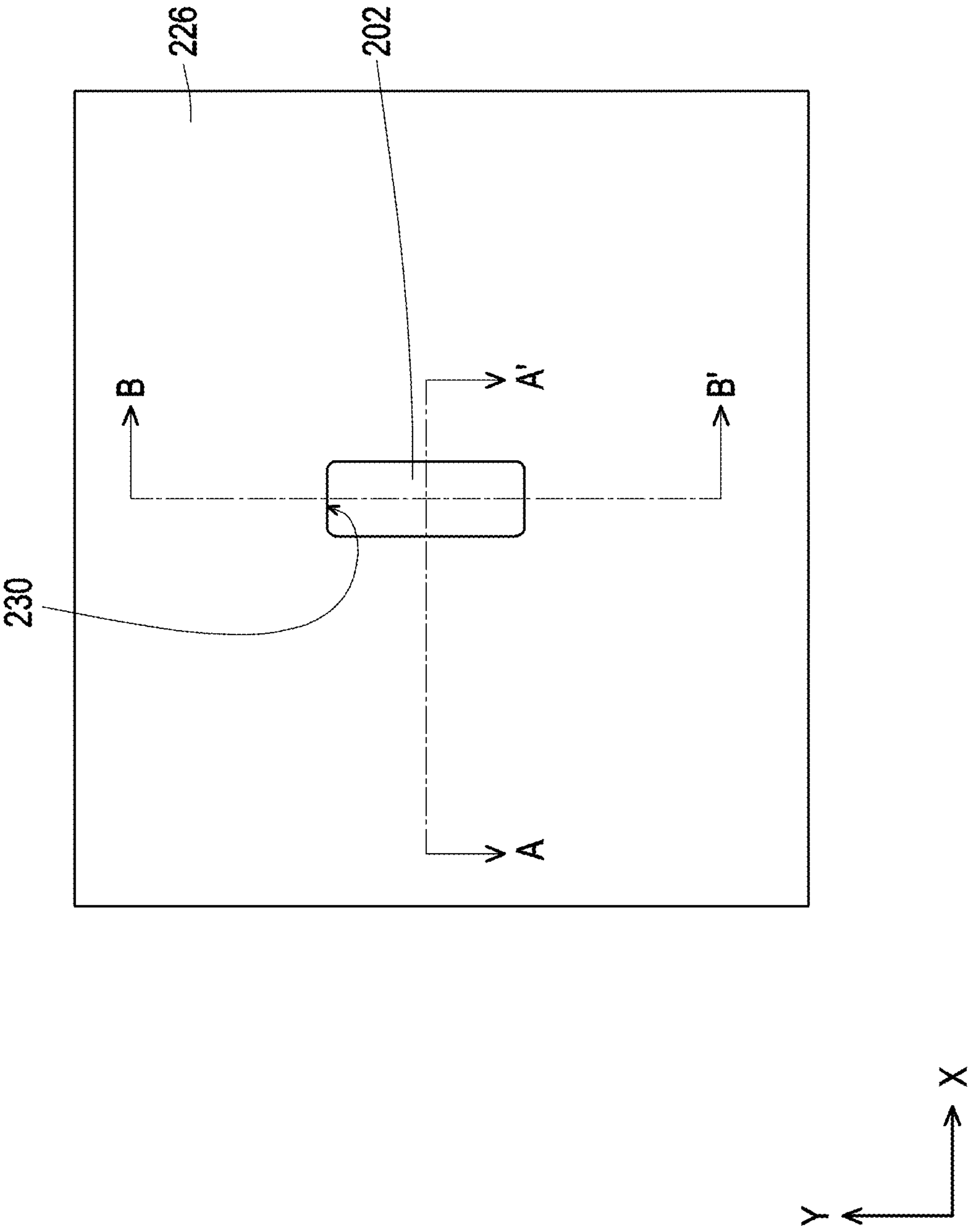
Figure 2C:
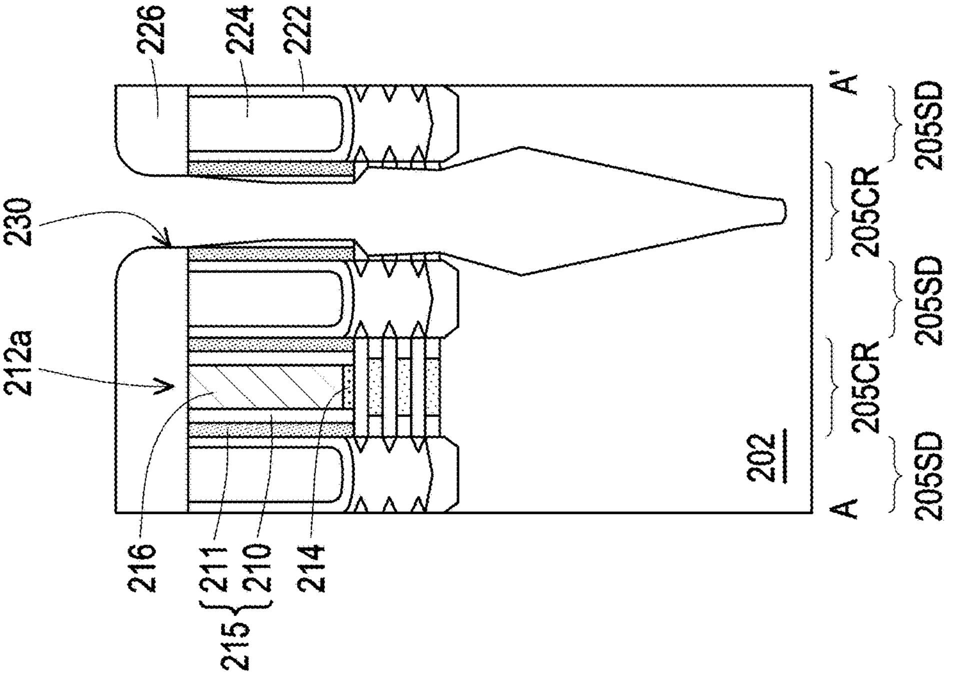
Figure 3C:
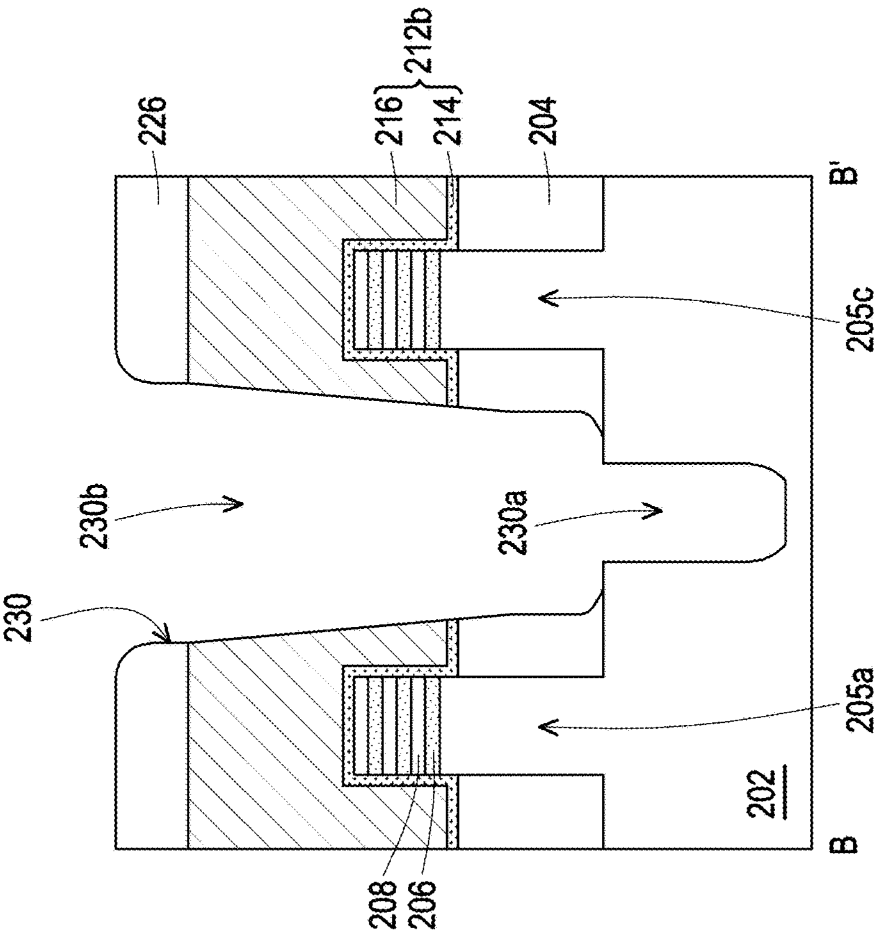

Referring to FIG. 1C, FIG. 2C, and FIG. 3C, an opening 230 is formed by removing a portion of the dummy gate structure 212*b*, a portion of the first spacers 210, the fin structure 205*b* directly underneath the portion of the dummy gate structure 212*b*, and a portion of the semiconductor substrate 202. In some embodiments, the opening 230 is formed by performing an etching process on the portion of the dummy gate structure 212*b*, the portion of the first spacers 210, the fin structure 205*b*, and the portion of the semiconductor substrate 202. The etching process may be a dry etching process, a wet etching process, or combinations thereof that implements a suitable etchant. In some embodiments, the second spacers 211 are not being damaged by the etching process. However, the disclosure is not limited thereto. In some alternative embodiments, the etching process also slightly etches the second spacers 211. As illustrated in FIG. 2C and FIG. 3C, the opening 230 extends from the hard mask layer 226 to the semiconductor substrate 202. For example, the opening 230 partially exposes the semiconductor substrate 202. In some embodiments, the opening 230 extends below a bottom surface of the channel regions 205CR of the fin structures 205. In some embodiments, the inner spacer features 219 of the fin structure 205*b* in the channel region 205CR are not fully removed such that the source/drain features 220 adjacent to the channel region 205CR are not damaged in the etching processes. As illustrated in FIG. 3C, the opening 230 may be divided into a bottom portion 230*a* and an upper portion 230*b*. In some embodiments, the bottom portion 230*a* is surrounded by the semiconductor substrate 202 while the upper portion 230*b* is surrounded by the STI region 204 and the dummy gate structure 212*b*. Due to etching selectivity, the bottom portion 230*a* of the opening 230 has a width smaller than that of the upper portion 230*b* of the opening 230. In some embodiments, the upper portion 230*b* of the opening 230 exhibits a trapezoidal shape from the cross-sectional view in FIG. 3C while the bottom portion 230*a* of the opening 230 exhibits a rectangular shape from the cross-sectional view in FIG. 3C.

Figure 1D:
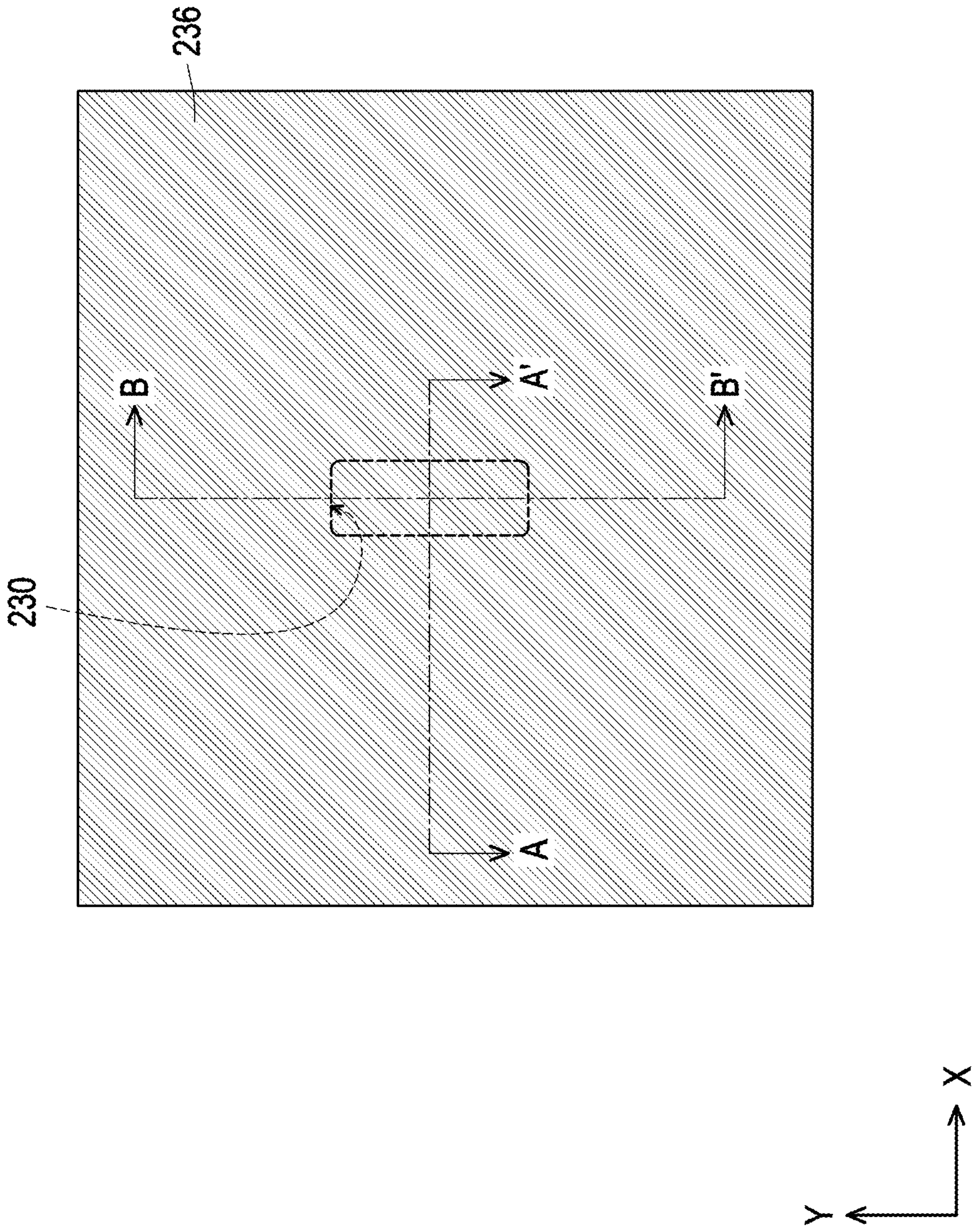
Figure 3D:
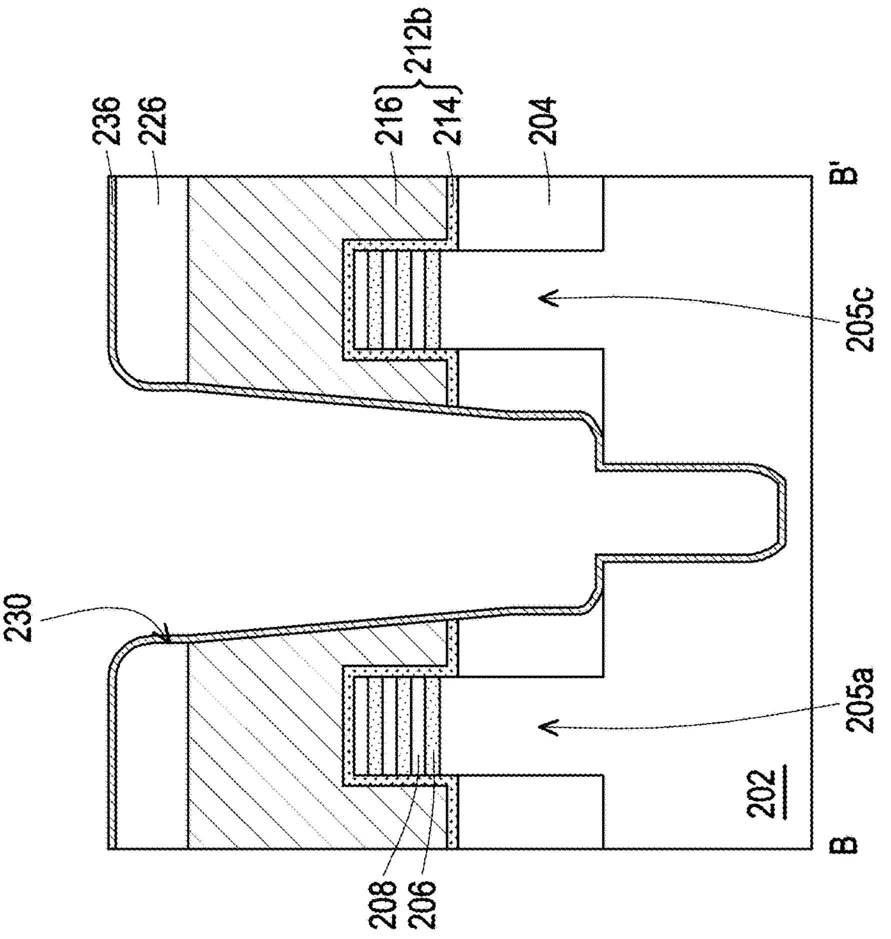
Figure 2D:
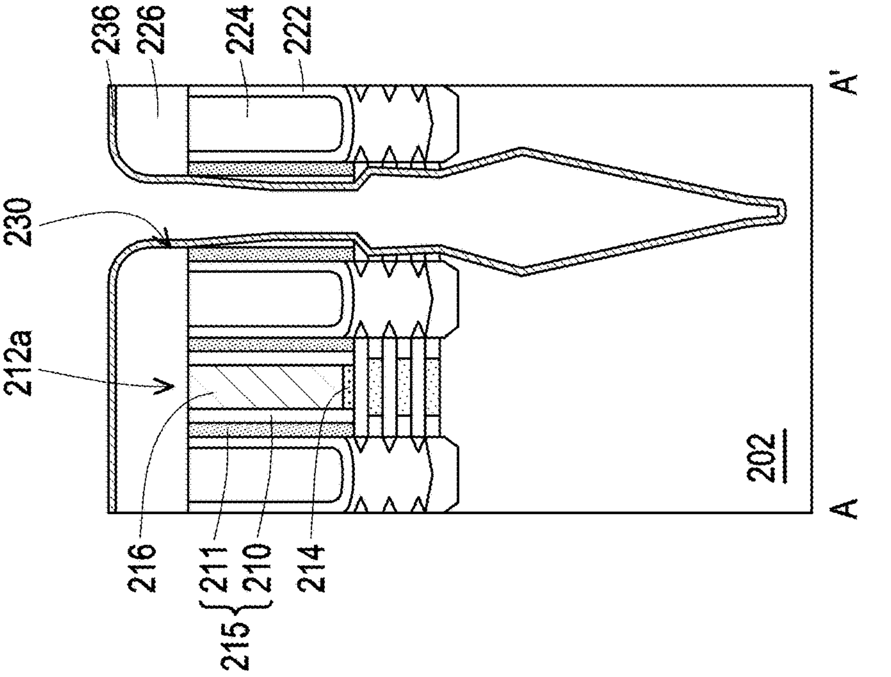

Referring to FIG. 1D, FIG. 2D, and FIG. 3D, a dielectric material layer 236 is conformally formed over the dummy gate structures 212 and the hard mask layer 226. The dielectric material layer 236 is also conformally formed in the opening 230. For example, the dielectric material layer 236 entirely covers sidewalls and a bottom surface of the opening 230. In some embodiments, the dielectric material layer 236 is conformally deposited to have a generally uniform thickness. The dielectric material layer 236 may be formed by performing a deposition process such as a CVD process, a PVD process, an ALD process, or other suitable deposition process. In some embodiments, the dielectric material layer 236 includes oxide material. For example, the dielectric material layer 236 includes silicon oxide.

Figure 1E:
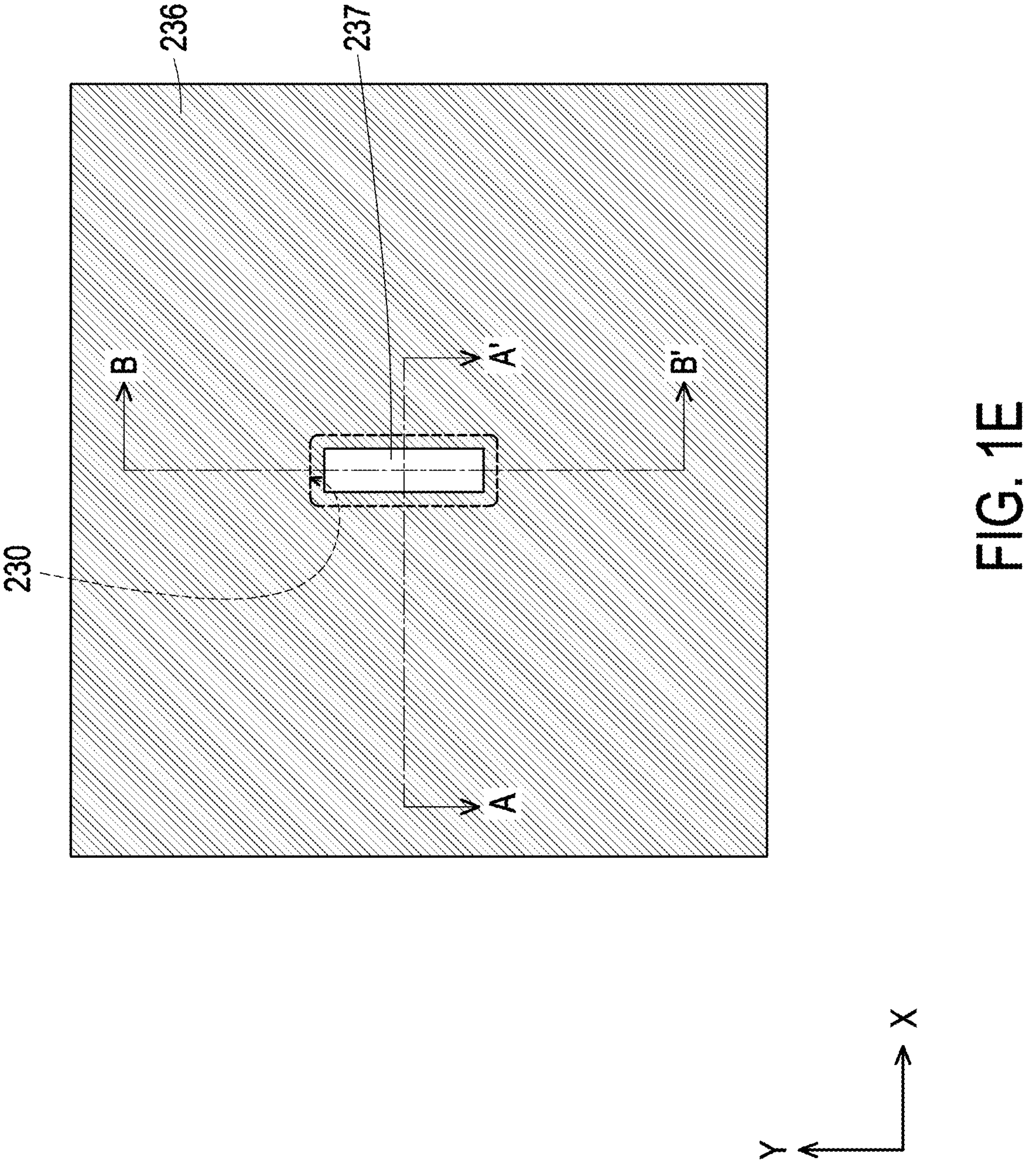
Figure 2E:
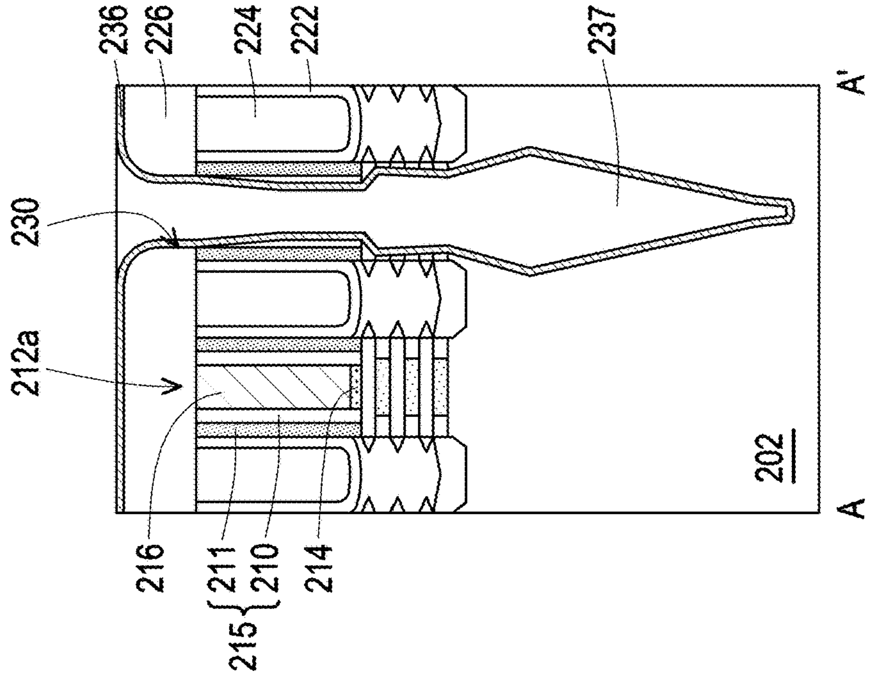
Figure 3E:
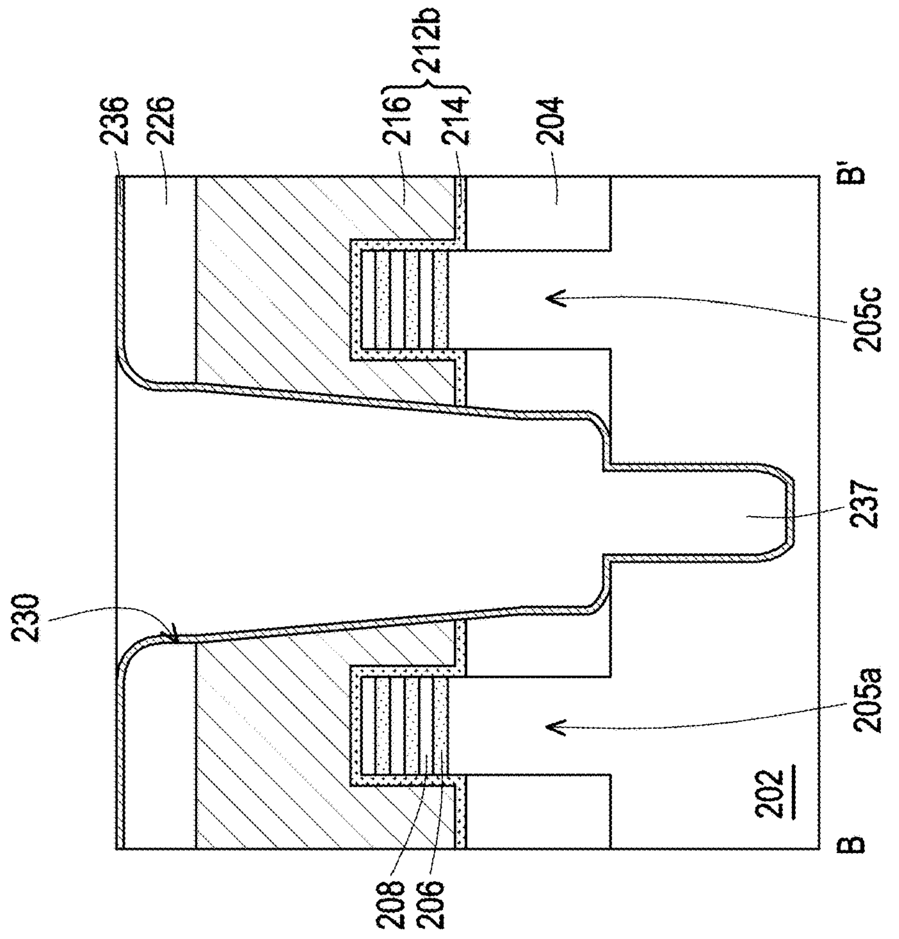

Referring to FIG. 1E, FIG. 2E, and FIG. 3E, a sacrificial material layer 237 is formed on the dielectric material layer 236 to fill up the opening 230. In an embodiment, the sacrificial material layer 237 may include or is a dielectric material layer. For example, the sacrificial material layer 237 includes a bottom anti-reflective coating (BARC) material. In some embodiments, the sacrificial material layer 237 may be formed by performing a deposition process such as a CVD process, a PVD process, an ALD process, or other suitable deposition process. In some embodiments, a planarization process (e.g., CMP) may be performed to remove excess sacrificial material layer 237 on the dielectric material layer 236. As illustrated in FIG. 3E, a top surface of the sacrificial material layer 237 is coplanar with a topmost surface of the dielectric material layer 236.

Figure 1F:
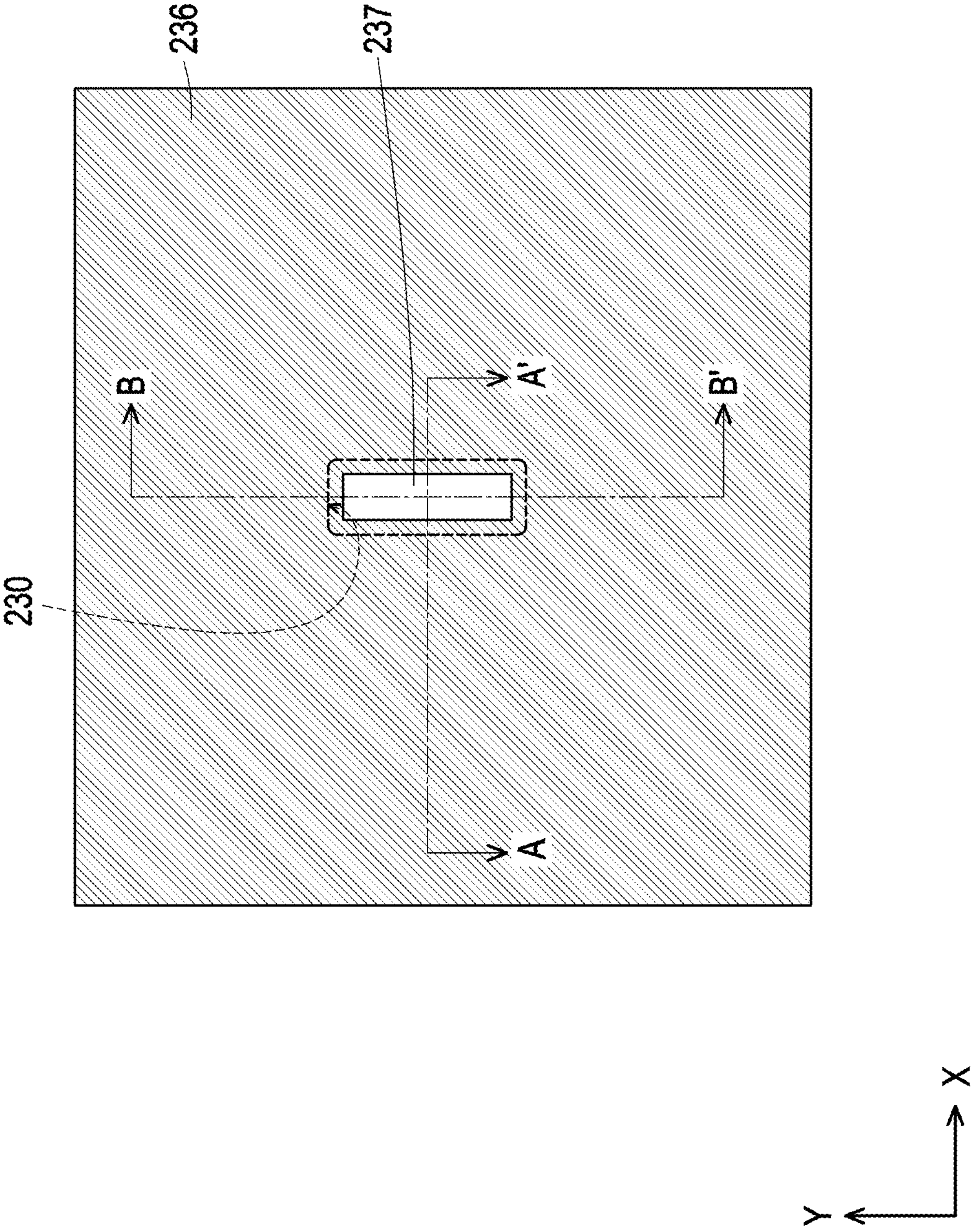
Figure 3F:
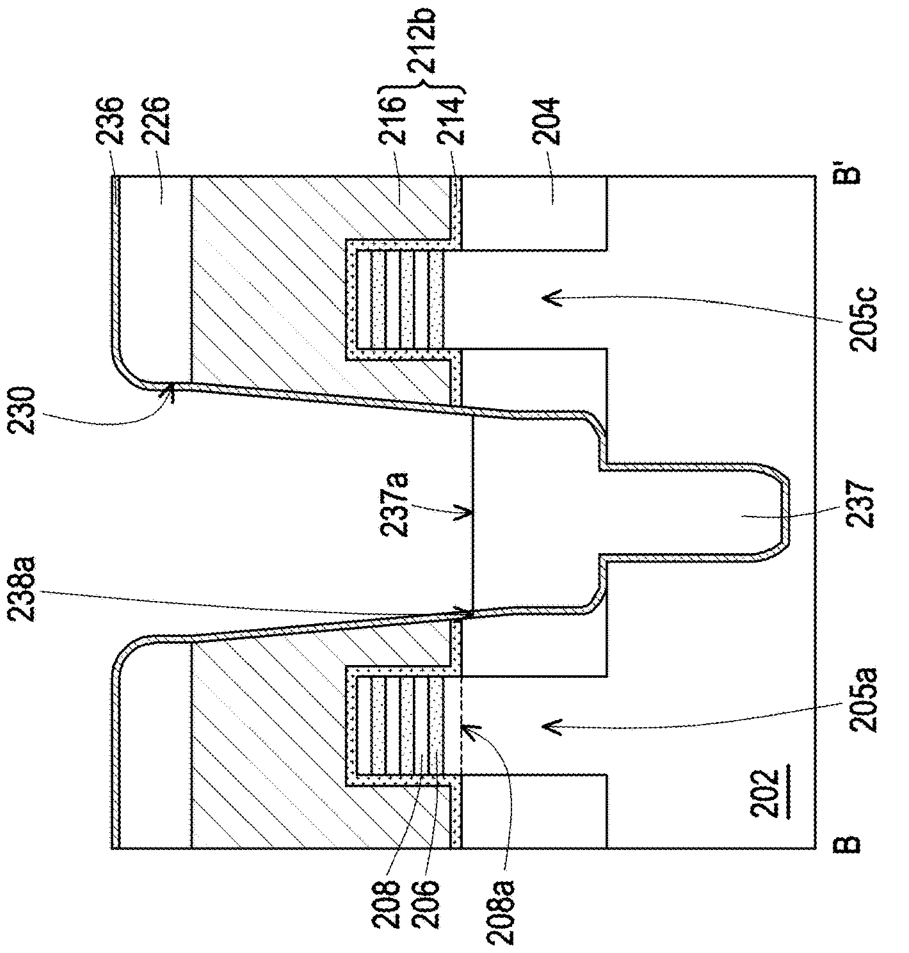
Figure 2F:
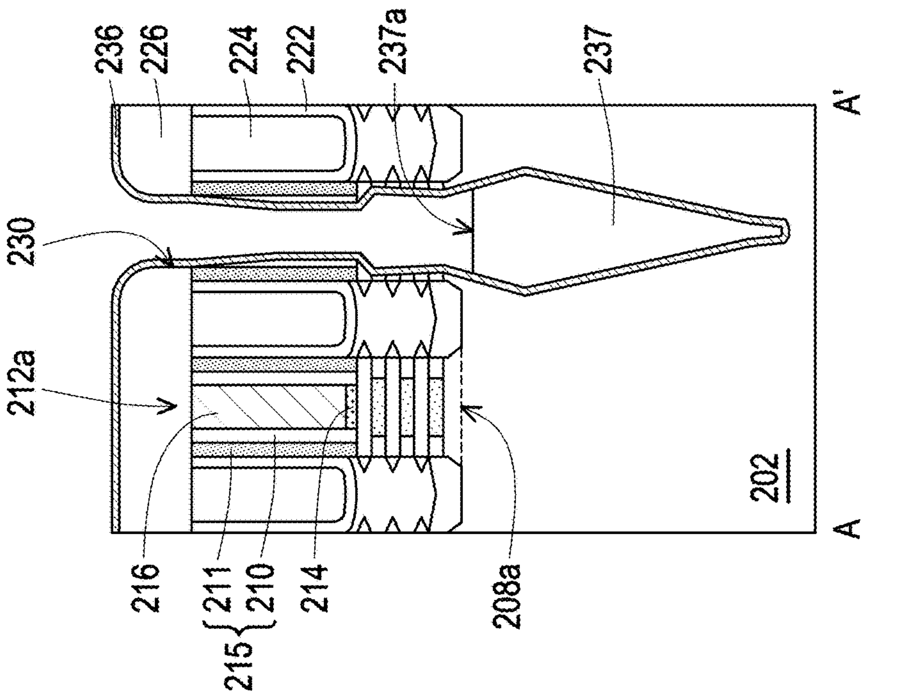

Referring to FIG. 1F, FIG. 2F, and FIG. 3F, an etching process is performed to selectively remove a portion of the sacrificial material layer 237 without damaging the dielectric material layer 236. The etching process may include a dry etching process, a wet etching process, other suitable processes, or combinations thereof. After the etching process, an upper portion of the dielectric material layer 236 is exposed, and a bottom portion of the dielectric material layer 236 wraps around a remaining portion of the sacrificial material layer 237. For example, a top surface 237*a* of the remaining portion of the sacrificial material 237 is lower than a bottom surface of the channel regions 205CR (i.e., a bottom surface 208*a* of the bottommost channel layer 208 in the channel regions 205CR).

Figure 1G:
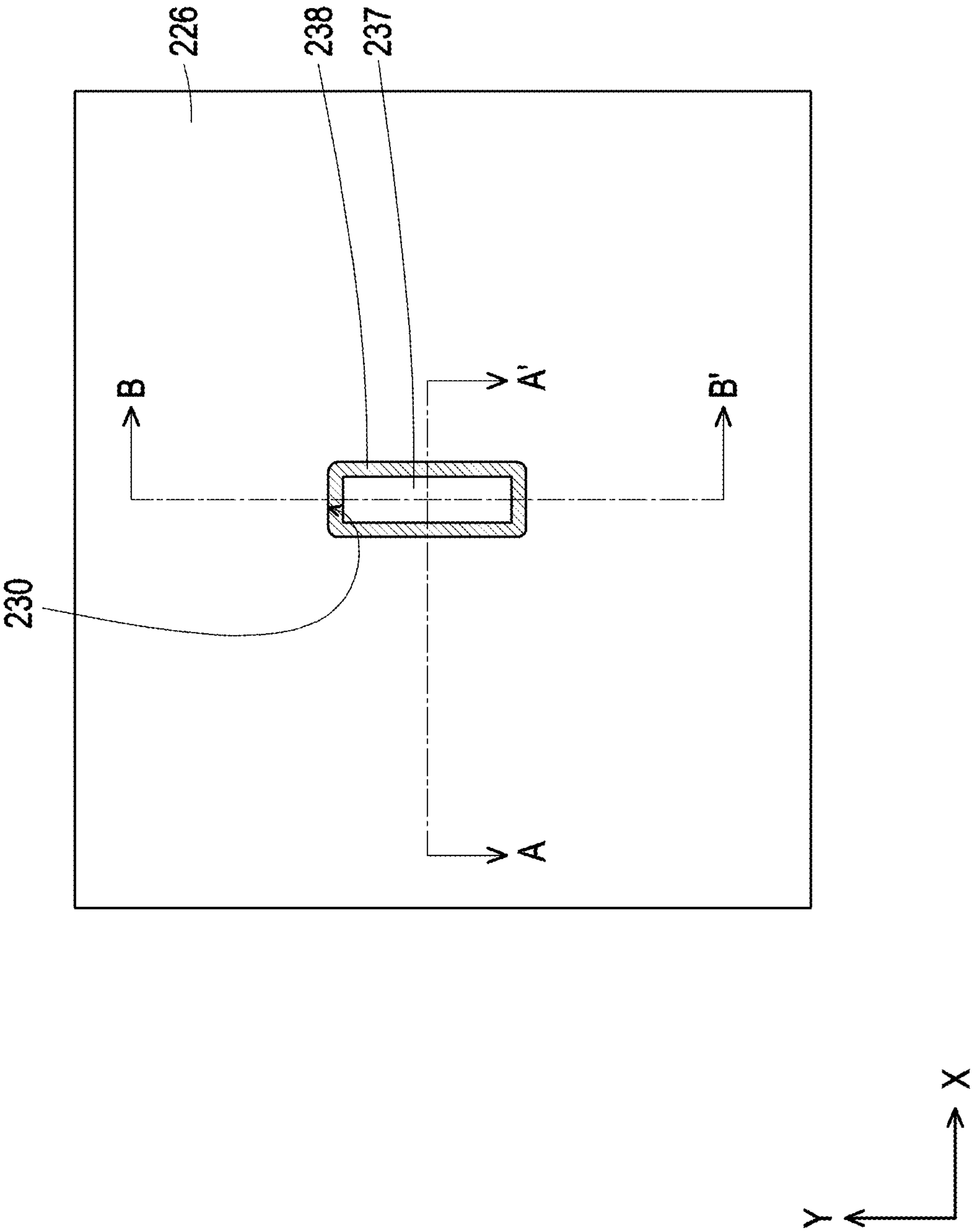
Figure 3G:
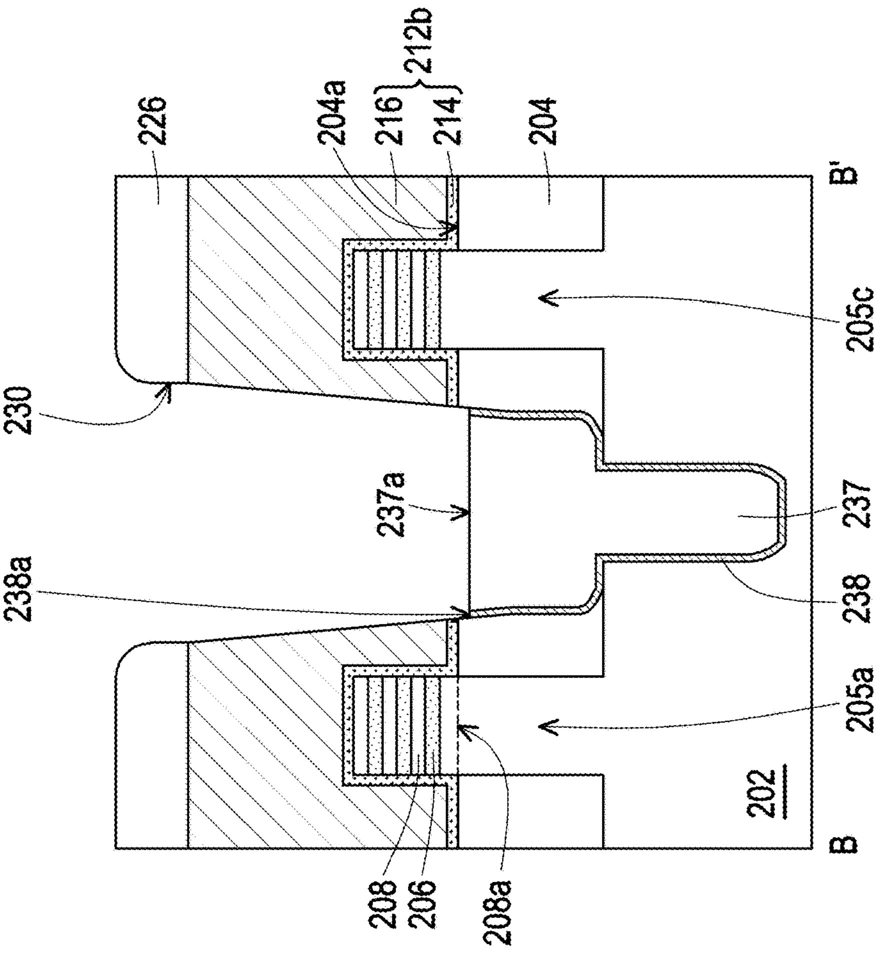
Figure 2G:
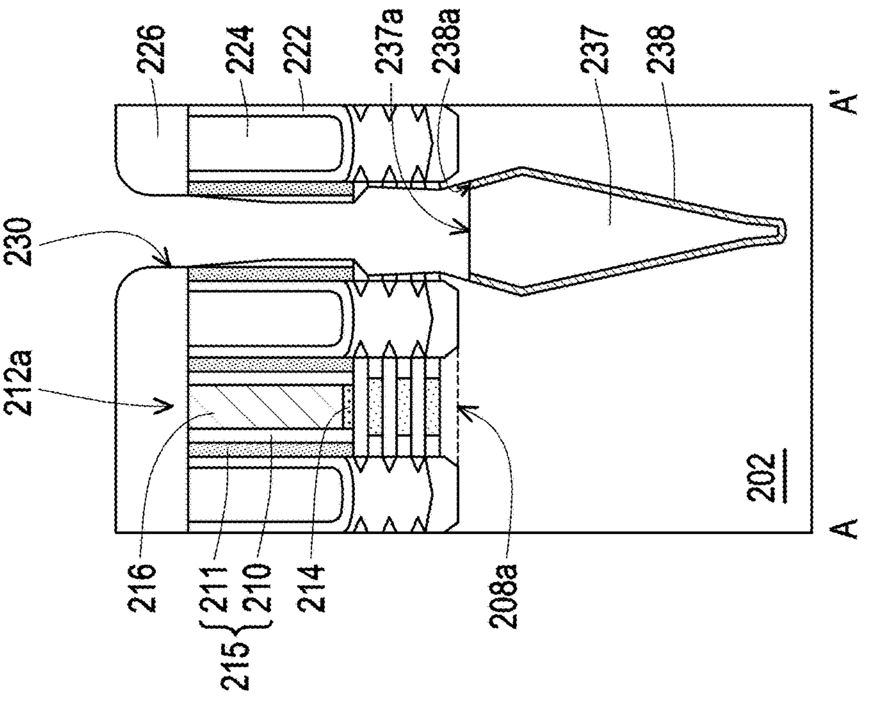

Referring to FIG. 1G, FIG. 2G, and FIG. 3G, an etching process is performed to remove the upper portion of the dielectric material layer 236 (i.e., the dielectric material layer 236 that is exposed by the sacrificial material layer 237), so as to form a dielectric layer 238. For example, the dielectric material layer 236 located at a level height higher than that of the sacrificial material layer 237 is removed to form the dielectric layer 238. The etching process may include a dry etching process, a wet etching process, other suitable processes, or combinations thereof. As illustrated in FIG. 2G and FIG. 3G, the top surface 237*a* of the remaining portion of the sacrificial material layer 237 is coplanar with a topmost surface 238*a* of the dielectric layer 238. In other words, the topmost surface 238*a* of the dielectric layer 238 is lower than the bottom surface of the channel regions 205CR (i.e., the bottom surface 208*a* of the bottommost channel layer 208 in the channel regions 205CR). In some embodiments, the topmost surface 238*a* of the dielectric layer 238 is also lower than top surfaces 204*a* of the STI regions 204.

Figure 1H:
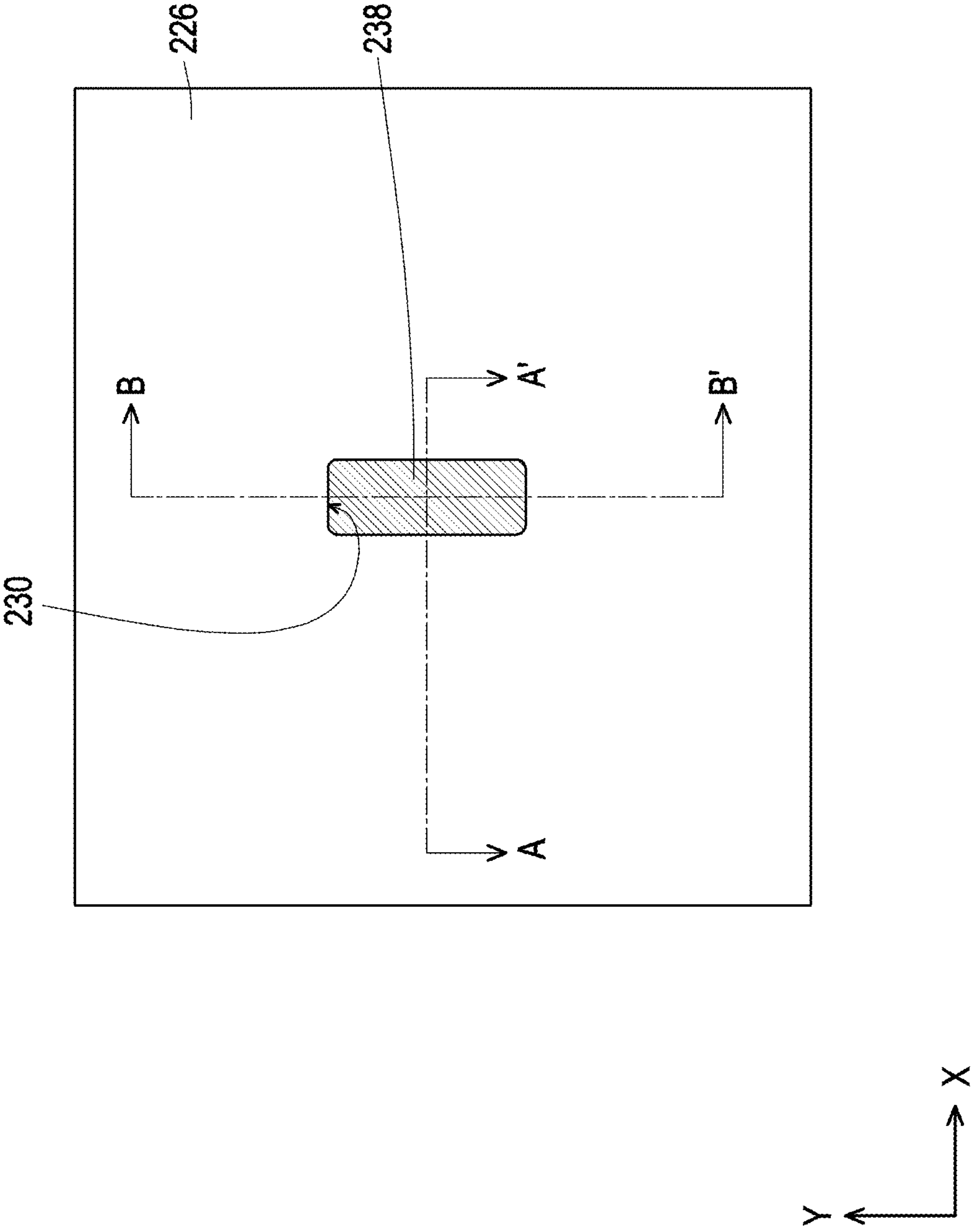
Figure 2H:
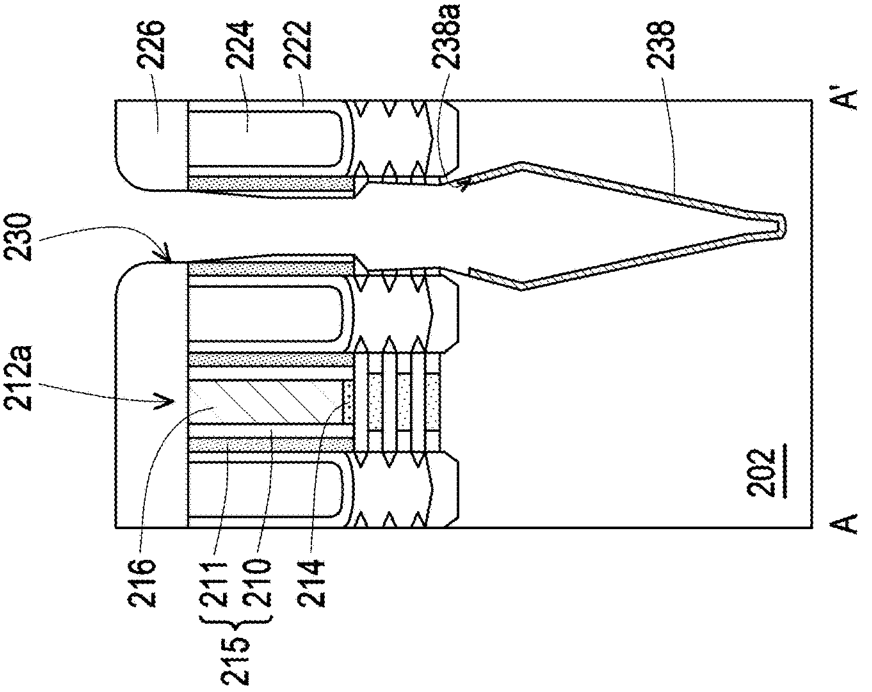
Figure 3H:
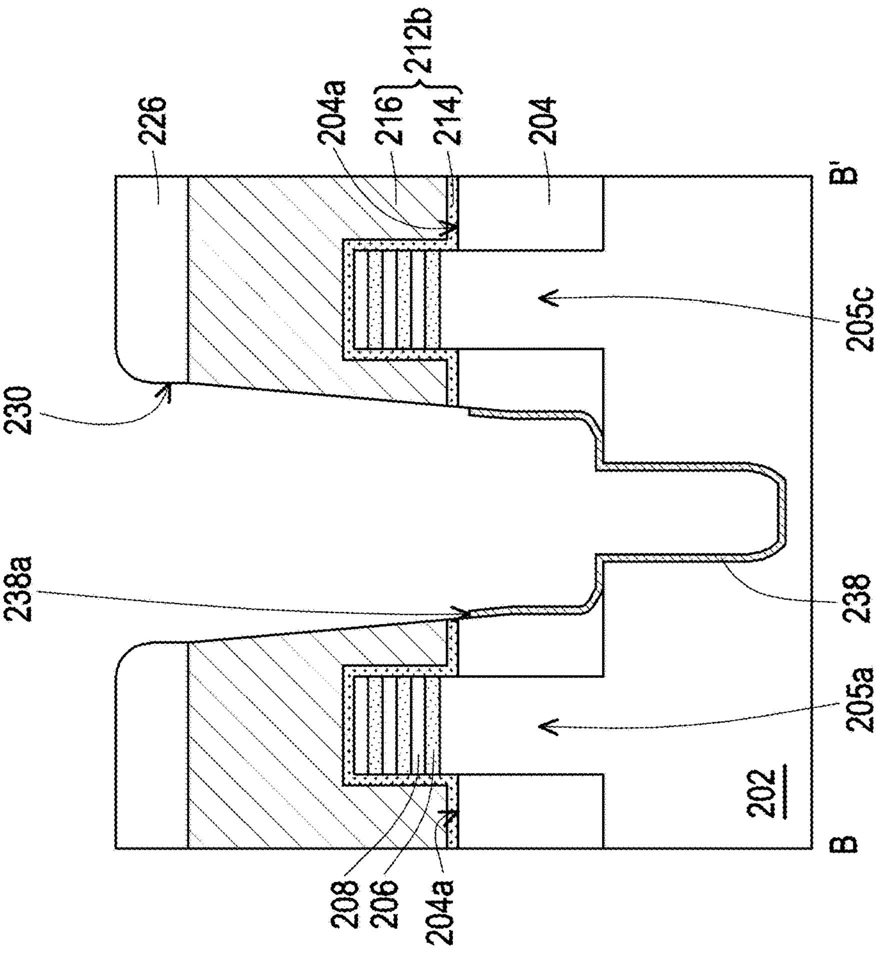

Referring to FIG. 1H, FIG. 2H, and FIG. 3H, an etching process is performed to selectively remove the remaining portion of the sacrificial material layer 237. The etching process may include a dry etching process, a wet etching process, other suitable processes, or combinations thereof. As illustrated in FIG. 1H, FIG. 2H and FIG. 3H, the dielectric layer 238 is exposed. In some embodiments, the dielectric layer 238 is located in the opening 230 and partially covers sidewalls of the opening 230. For example, the lower portion of the sidewalls of the openings 230 is covered by the dielectric layer 238 while the upper portion of the sidewalls of the openings 320 is not covered by the dielectric layer 238. In some embodiments, the dummy gate electrode 216 is exposed by the dielectric layer 238.

Figure 1I:
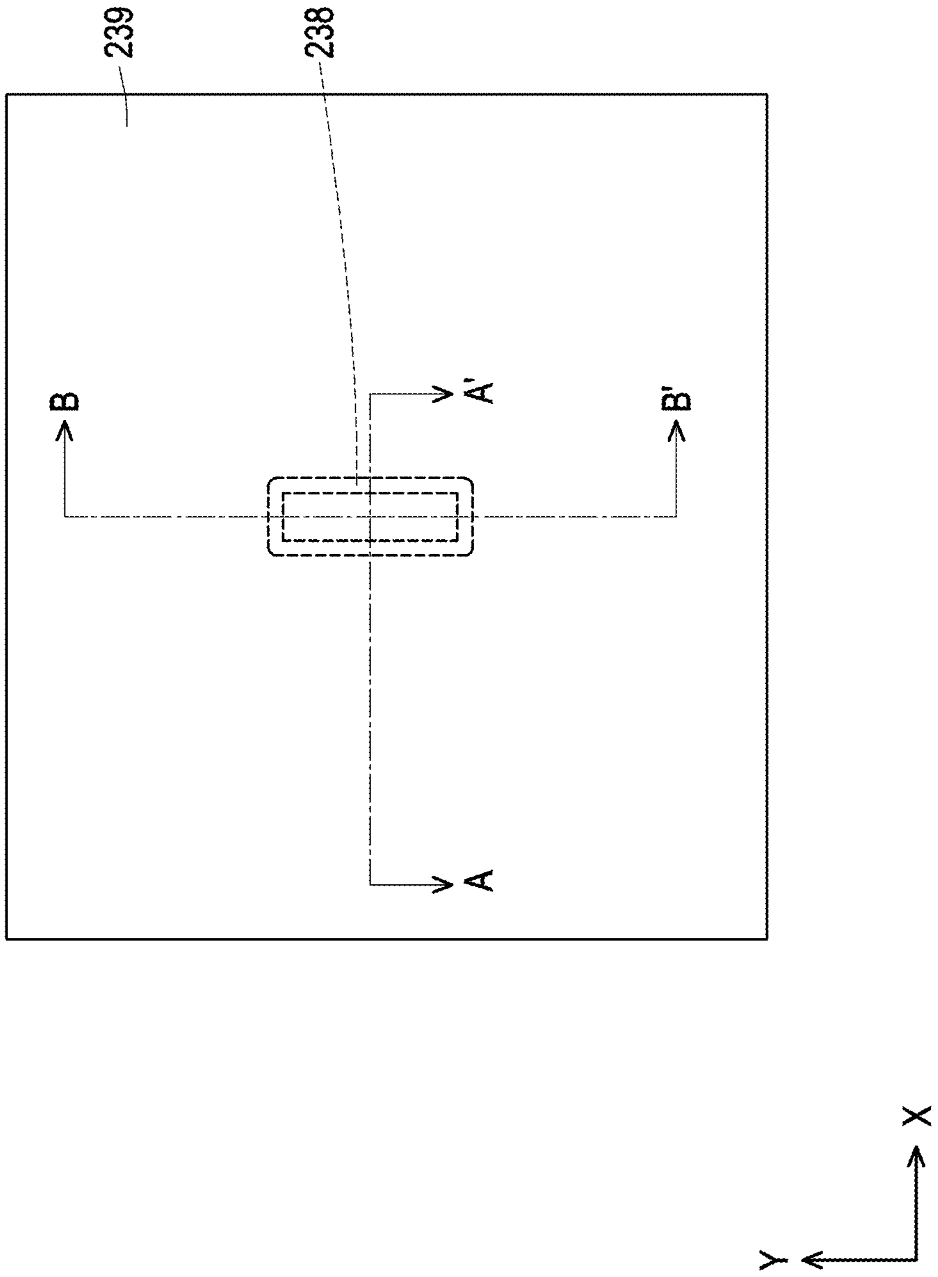
Figure 3I:
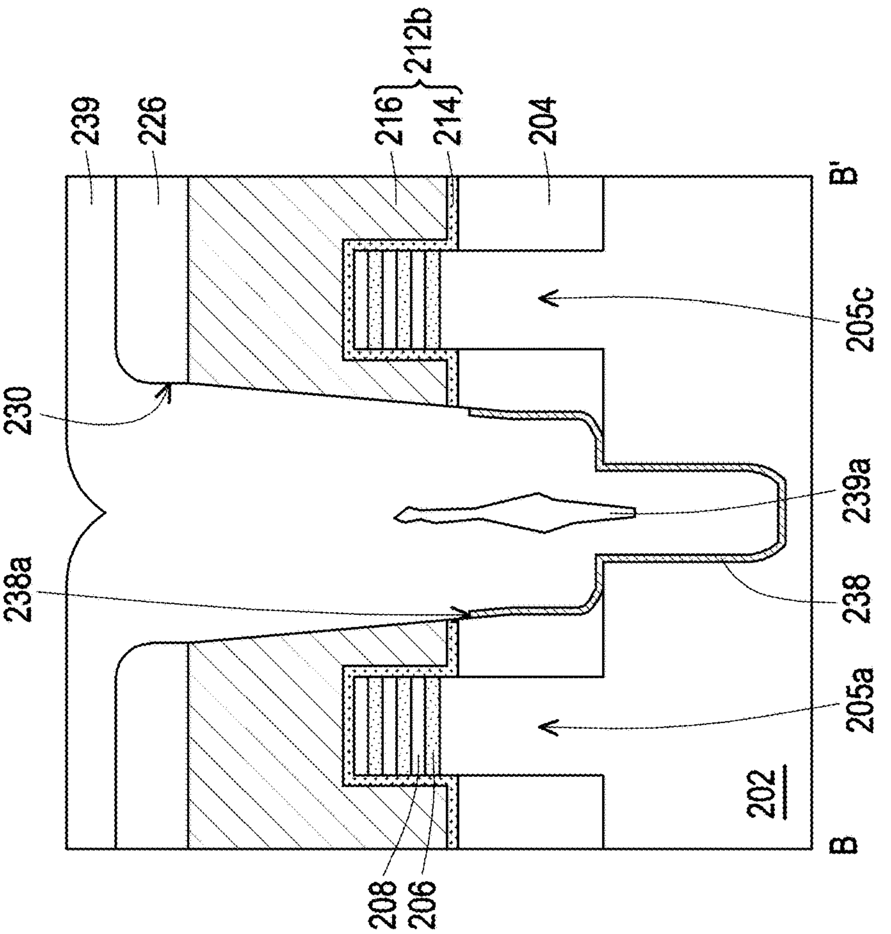
Figure 2I:
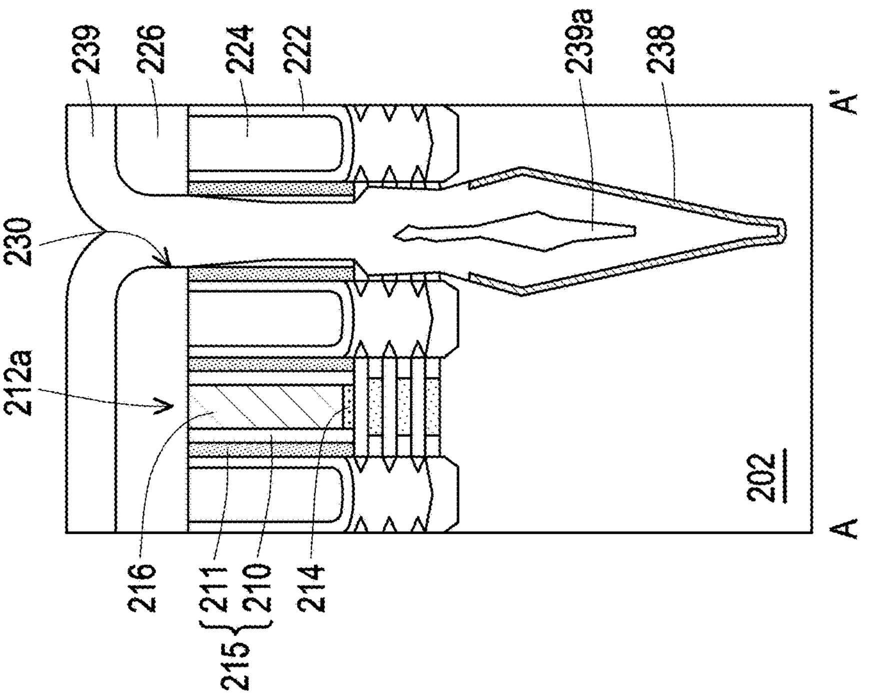

Referring to FIG. 1I, FIG. 2I, and FIG. 3I, a dielectric material layer 239 is deposited on the hard mask layer 226 and in the opening 230. The deposition of the dielectric material layer 239 may include conformal deposition processes such as ALD (Plasma Enhance ALD (PEALD) or thermal ALD), CVD, or the like. In some embodiments, a material of the dielectric material layer 239 and a material of the dielectric layer 238 are different. In some embodiments, the dielectric material layer 239 includes a nitride material. For example, the dielectric material layer 239 includes silicon nitride. As illustrated in FIG. 2I and FIG. 3I, a void 239*a* is formed in the dielectric material layer 239 due to the high aspect ratio of the opening 230. However, the disclosure is not limited thereto. In some alternative embodiments, the dielectric material layer 239 may be deposited without forming the void 239*a* therein.

Figure 1J:
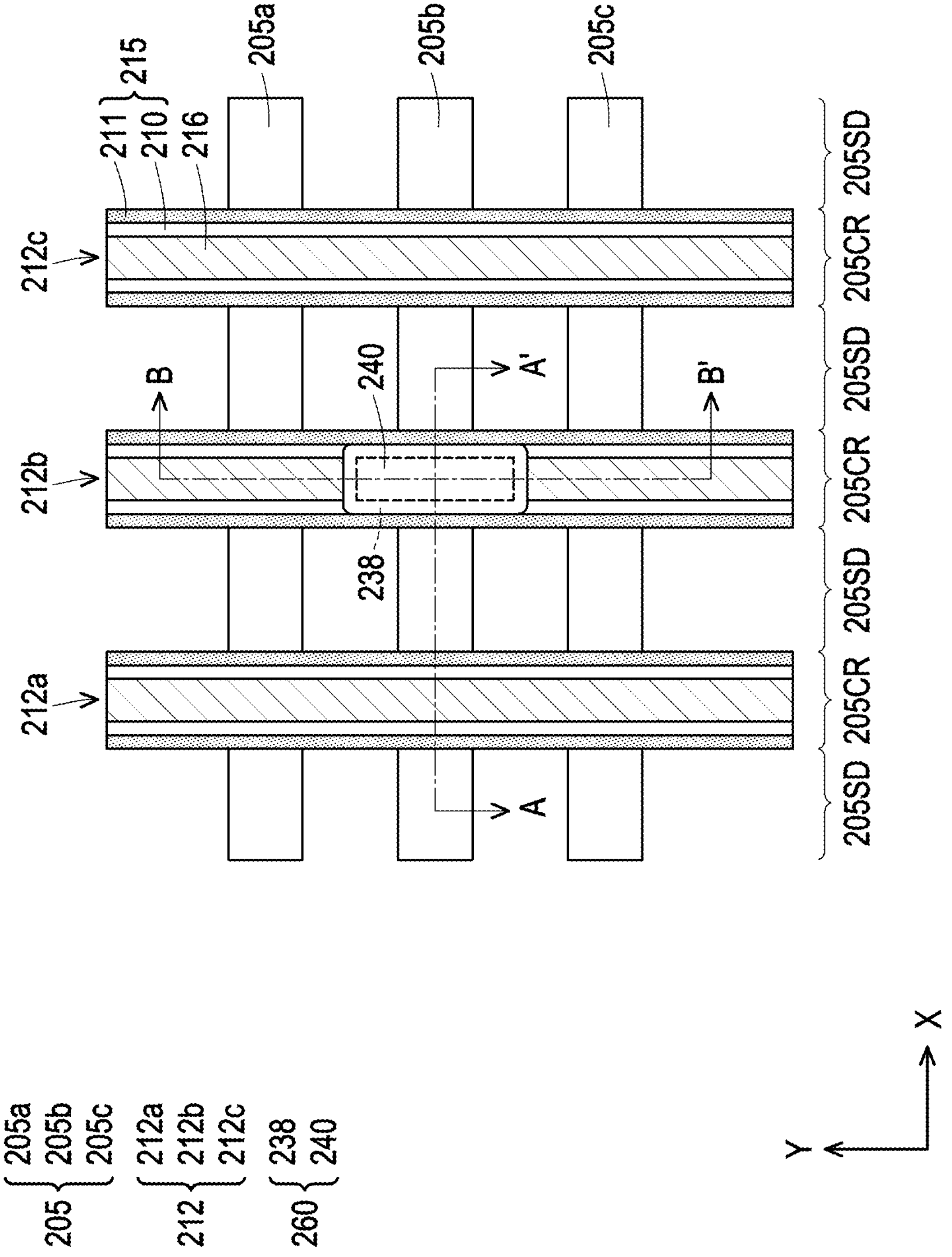
Figure 3J:
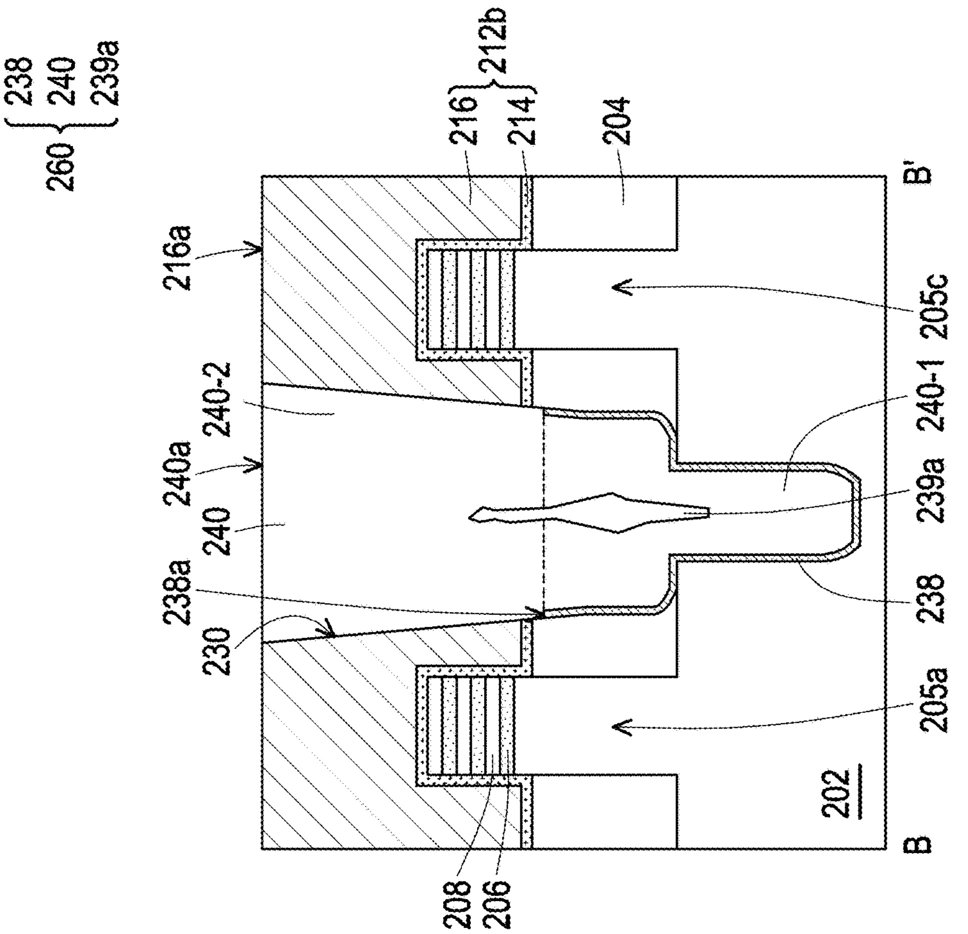
Figure 2J:
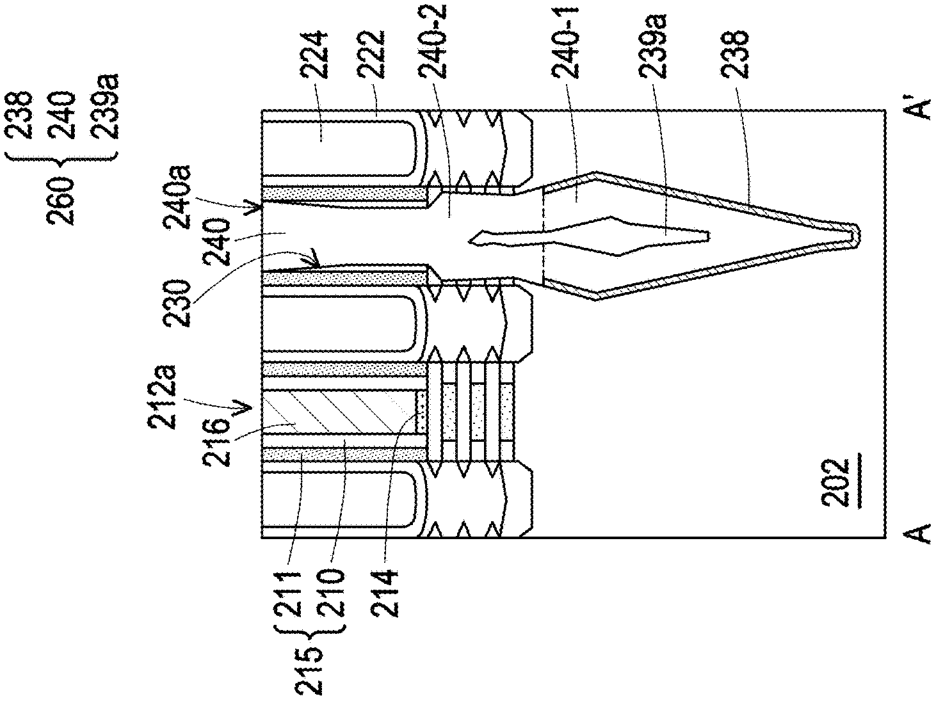

Referring to FIG. 1J, FIG. 2J, and FIG. 3J, the hard mask layer 226 and a portion of the dielectric material layer 239 are removed to form a dielectric layer 240. In some embodiments, the hard mask layer 226 and the portion of the dielectric material layer 239 are removed through a planarization process (e.g., CMP). After the planarization process, top surfaces 216*a* of the dummy gate electrodes 216 are exposed. Meanwhile, the dielectric layer 240 and the void 239*a* collectively fills up the opening 230. As illustrated in FIG. 3J, a portion of the dielectric layer 238 is sandwiched between the semiconductor substrate 202 and the dielectric layer 240, and another portion of the dielectric layer 238 is sandwiched between the STI region 204 and the dielectric layer 240.

As illustrated in FIG. 2J and FIG. 3J, the dielectric layer 240 encloses the void 239*a*. In some embodiments, the dielectric layer 238, the dielectric layer 240, and the void 239*a* are collectively referred to as a composite isolation structure 260. In some embodiments, the composite isolation structure 260 may be referred to as a "CPODE structure" to electrically isolate adjacent devices.

As illustrated in FIG. 3J, the top surface 216*a* of the dummy gate electrode 216 is coplanar with a top surface 240*a* of the dielectric layer 240. Moreover, as illustrated in FIG. 2J, the top surface 240*a* of the dielectric layer 240 is also coplanar with a top surface of the CESL 222, a top surface of the ILD layer 224, and top surfaces of the spacers 215. As illustrated in FIG. 2J and FIG. 3J, the dielectric layer 240 includes a first portion 240-1 and a second portion 240-2 stacked on the first portion 240-1. In some embodiments, the first portion 240-1 of the dielectric layer 240 is surrounded by the dielectric layer 238. Meanwhile, the second portion 240-2 of the dielectric layer 240 covers the topmost surface 238*a* of the dielectric layer 238. For example, the second portion 240-2 of the dielectric layer 240 is in physical contact with the topmost surface 238*a* of the dielectric layer 238.

Figure 1K:
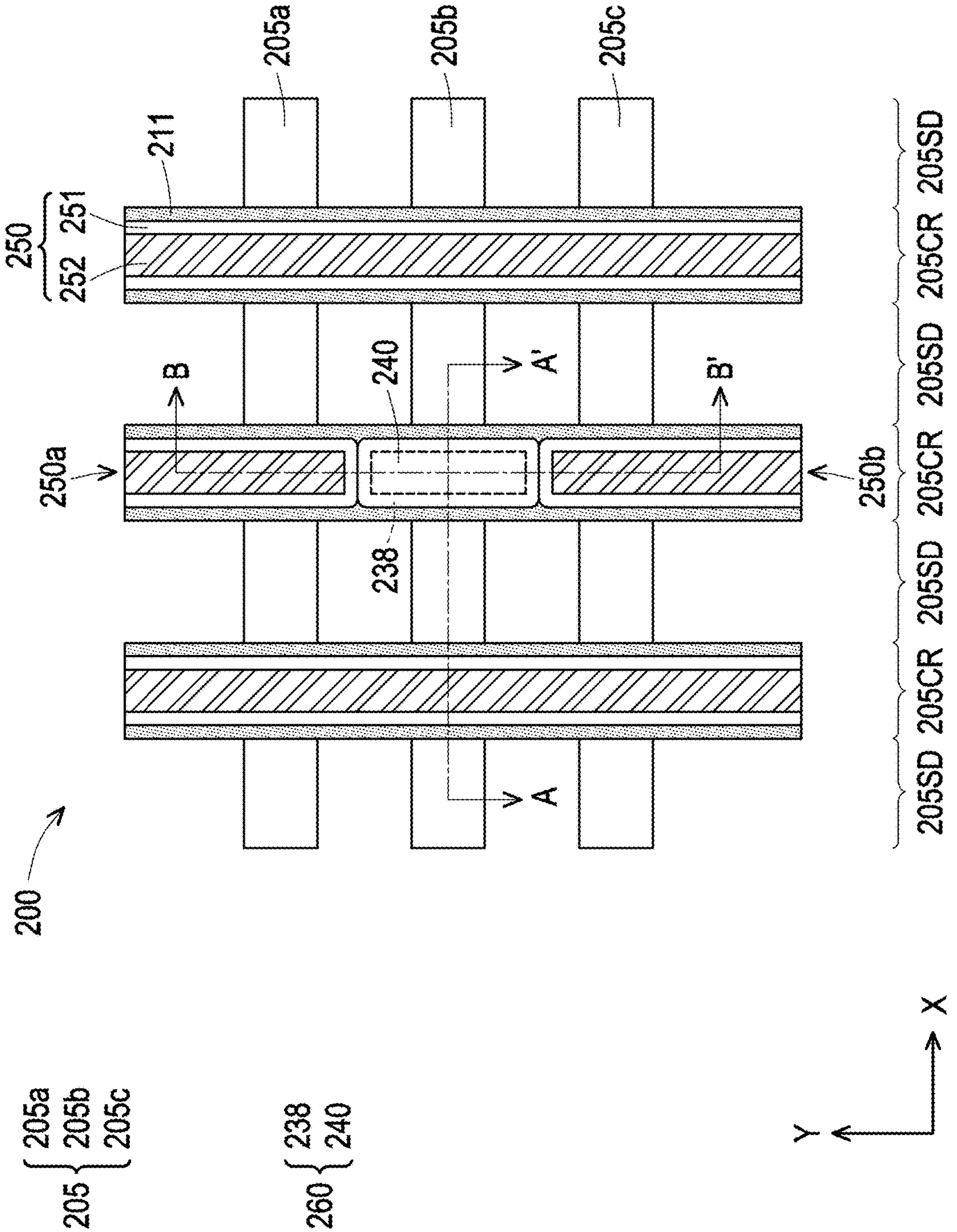
Figure 2K:
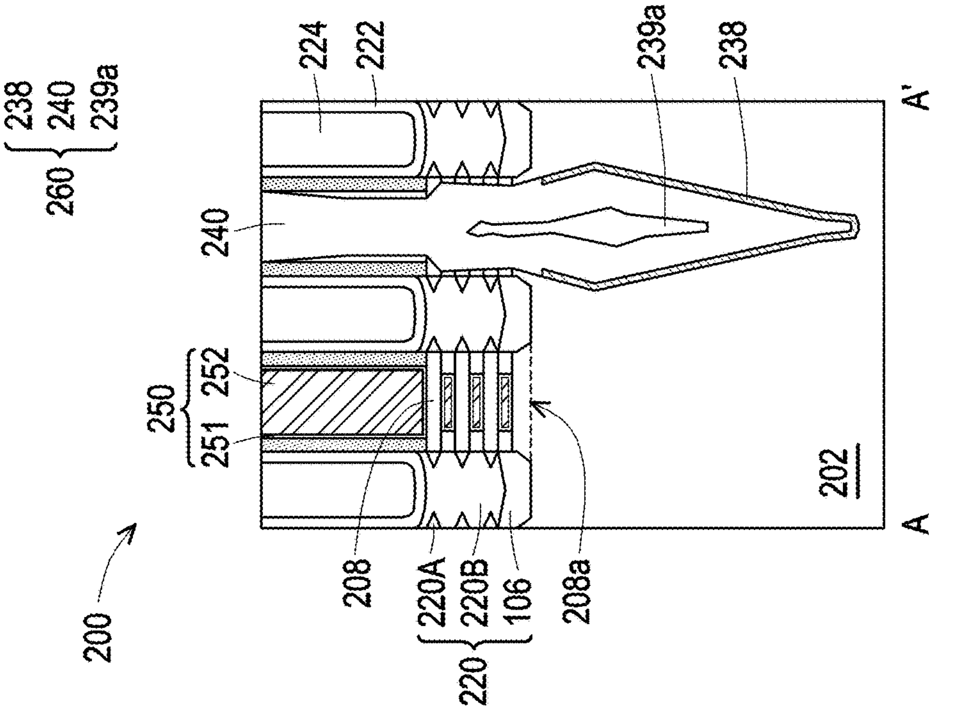
Figure 3K:
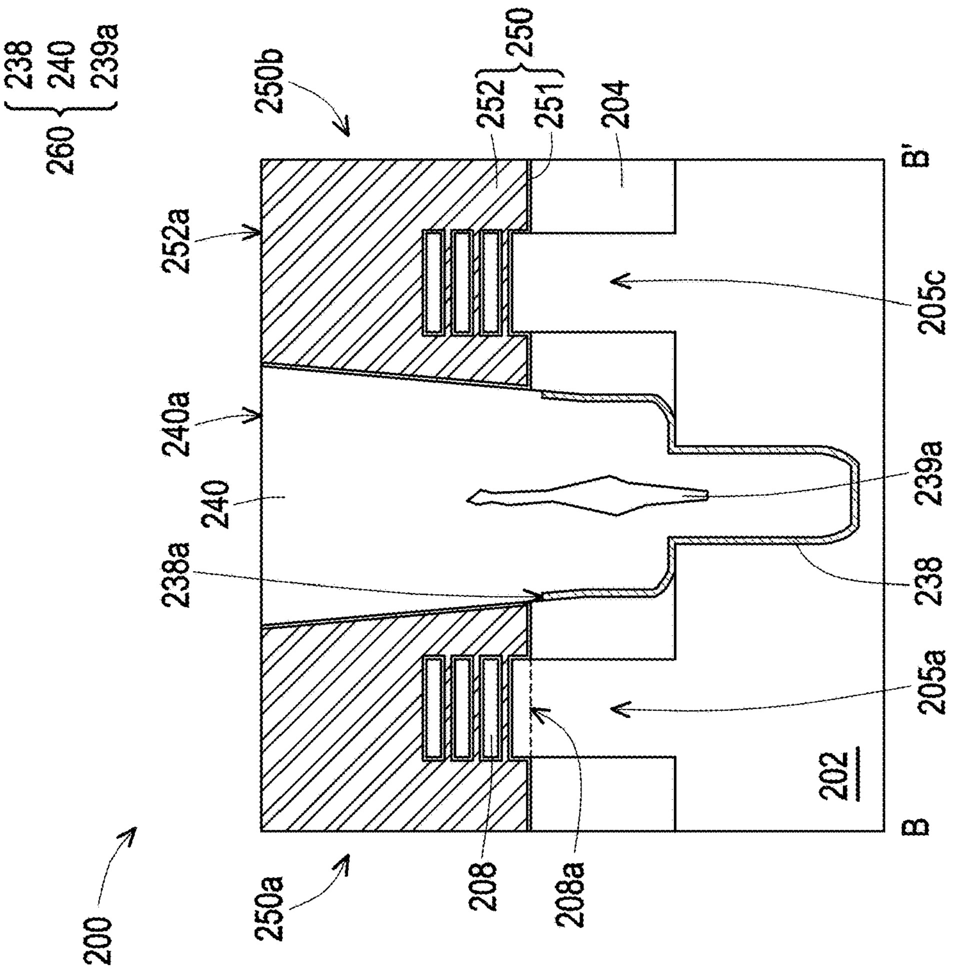

Referring to FIG. 1K, FIG. 2K, and FIG. 3K, the dummy gate electrode 216, the dielectric layer 214, and the first spacers 210 of the dummy gate structures 212 are removed. As illustrated in FIG. 1K, FIG. 2K, and FIG. 3K, the second spacers 211 are not removed. However, the disclosure is not limited thereto. In some alternative embodiments, the second spacers 211 may also be removed. In some embodiments, the removal of the dummy gate structures 212 results in gate trenches (not shown) over the channel regions 205CR. The removal of the dummy gate structures 212 may include one or more etching processes that are selective to the material of the dummy gate electrode 216, the dielectric layer 214, and the first spacers 210. For example, the removal of the dummy gate structures 212 may be performed using as a selective wet etch, a selective dry etch, or a combination thereof. After the removal of the dummy gate structures 212, the sacrificial layers 206 and the channel layers 208 are exposed. Thereafter, the sacrificial layers 206 between the channel layers 208 in the channel regions 205CR are removed. The selective removal of the sacrificial layers 206 allows the channel layers 208 to form channels between the source/drain features 220. In some embodiments, the channel layers 208 may be referred to as nanosheets. In other words, the channel regions 205CR includes nanosheets. The selective removal of the sacrificial layers 206 may be implemented by selective dry etch, selective wet etch, or other selective etch processes.

Subsequently, a plurality of gate structures 250 are formed in the gate trenches and are formed around the channel layers 208 to obtain a semiconductor device 200. For example, the gate structures 250 are formed within the gate trenches and are deposited in the space created by the removal of the sacrificial layers 206 in the channel regions 205CR. That is, the gate structures 250 wrap around the channel layers 208 (i.e., the nanosheets of the channel regions 205CR). In some embodiments, each gate structure 250 includes a gate dielectric layer 251 and a gate electrode 252 on the gate dielectric layer 251. In some embodiments, formation of the gate structures 250 includes deposition of the gate dielectric layer 251, deposition of the gate electrode 252, and a planarization process to remove excess material.

In some embodiments, the gate dielectric layer 251 includes an interfacial layer and a high-k dielectric layer. The interfacial layer may include a dielectric material such as silicon oxide, hafnium silicate, or silicon oxynitride. The interfacial layer may be deposited using chemical oxidation, thermal oxidation, ALD, CVD, and/or other suitable method. The high-K dielectric layer used in the gate dielectric layer 251 includes dielectric materials having a high dielectric constant, for example, greater than that of thermal silicon oxide (~3.9). Examples of the high-K dielectric layer used in the gate dielectric layer 251 includes hafnium oxide ($HfO_2$), titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. The high-K dielectric layer may be formed by ALD, PVD, CVD, oxidation, and/or other suitable methods.

The gate electrode 252 of the gate structures 250 may include a single layer structure or a multi-layer structure. When the gate electrode 252 is a multi-layer structure, the gate electrode 252 includes various combinations of a metal layer with a selected work function to enhance the device performance (work function metal layer), a liner layer, a wetting layer, an adhesion layer, a metal alloy or a metal silicide. By way of example, the gate electrode 252 includes titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In some embodiments, the gate electrode 252 is formed by ALD, PVD, CVD, e-beam evaporation, or other suitable process. In some embodiments, a planarization process, such as a CMP process, may be performed to remove excessive metal from the gate electrode 252 of the gate structures 250, and thereby provide substantially planar top surfaces 252*a* of the gate structures 250. As illustrated in FIG. 3K, the top surfaces 252*a* of the gate structures 250 are coplanar with the top surface 240*a* of the dielectric layer 240 of the composite isolation structure 260.

As illustrated in FIG. 1B to FIG. 1K, FIG. 2B to FIG. 2K, and FIG. 3B to FIG. 3K, the composite isolation structure 260 is disposed at location that is originally occupied by the dummy gate structure 212*b* before the partial removal of the dummy gate structure 212*b*. As illustrated in FIG. 1K, at least one of the gate structure 250 is divided into a first gate structure 250*a* and a second gate structure 250*b*. After the dummy gate structures 212 are replaced by the gate structures 250, the first gate structure 250*a* and the second gate structure 250*b* are formed on two opposite sides of the composite isolation structure 260, as shown in FIG. 1K and FIG. 3K. In some embodiments, the first gate structure 250*a* is disposed on the fin structure 205*a* while the second gate structure 250*b* is disposed on the fin structure 205*c*. In some embodiments, the first gate structure 250*a*, the channel layers 208 of the fin structure 205*a* surrounded by the first gate structure 250*a*, and the source/drain features 220 aside the first gate structure 250*a* may be collectively referred as a first device. The second gate structure 250*b*, the channel layers 208 of the fin structure 205*c* surrounded by the second gate structure 250*b*, and the source/drain features 220 aside the second gate structure 250*b* may be collectively referred as a second device. As mentioned above, since the first gate structure 250*a* wraps around the channel layers 208 in the channel regions 205CR of the fin structure 205*a*, the first device may be referred to as a gate-all-around (GAA) transistor. Similarly, since the second gate structure 250*b* wraps around the channel layers 208 in the channel regions 205CR of the fin structure 205*c*, the second device may be also be referred to as a GAA transistor.

As illustrated in FIG. 1K and FIG. 3K, since the composite isolation structure 260 is disposed between the first device and the second device, the composite isolation structure 260 is able to avoid electrical shorting and improve density of device, such that the separation distance between adjacent devices may be reduced or minimized. Moreover, since the topmost surface 238*a* of the dielectric layer 238 of the composite isolation structure 260 is lower than the bottom surface of the channel region 205CR (i.e., a bottom surface 208*a* of the bottommost channel layer 208 in the channel regions 205CR), the current leakage due to the material of the dielectric layer 238 of the composite isolation structure 260 may be sufficiently alleviated, thereby improving the performance of the semiconductor device 200.

FIG. 4A to FIG. 4E are simplified top views illustrating various stages of a method of manufacturing a semiconductor device 400 in accordance with some alternative embodiments of the disclosure. FIG. 5A to FIG. 5E are respectively cross-sectional views of the semiconductor device 400 taken along line A-A' in FIG. 4A to FIG. 4E. FIG. 6A to FIG. 6E are respectively cross-sectional views of the semiconductor device 400 taken along line B-B' in FIG. 4A to FIG. 4E. For simplicity and clarity, some elements shown in the cross-sectional views of FIG. 5A to FIG. 5E and FIG. 6A to FIG. 6E are omitted in the top views of FIG. 4A to FIG. 4E. The embodiment of FIG. 4A to FIG. 4E, FIG. 5A to FIG. 5E, and FIG. 6A to FIG. 6E is similar to the embodiment of FIG. 1A to FIG. 1K, FIG. 2A to FIG. 2K, and FIG. 3A to FIG. 3K. Therefore, unless specified otherwise, the materials and the formation processes of the components in these embodiments are essentially the same as the like components, which are denoted by like reference numerals in the preceding embodiments. The details regarding the formation process and the materials of the components shown in FIG. 4A to FIG. 4E, FIG. 5A to FIG. 5E, and FIG. 6A to FIG. 6E may thus be found in the discussion of the embodiment of FIG. 1A to FIG. 1K, FIG. 2A to FIG. 2K, and FIG. 3A to FIG. 3K.

Figure 4A:
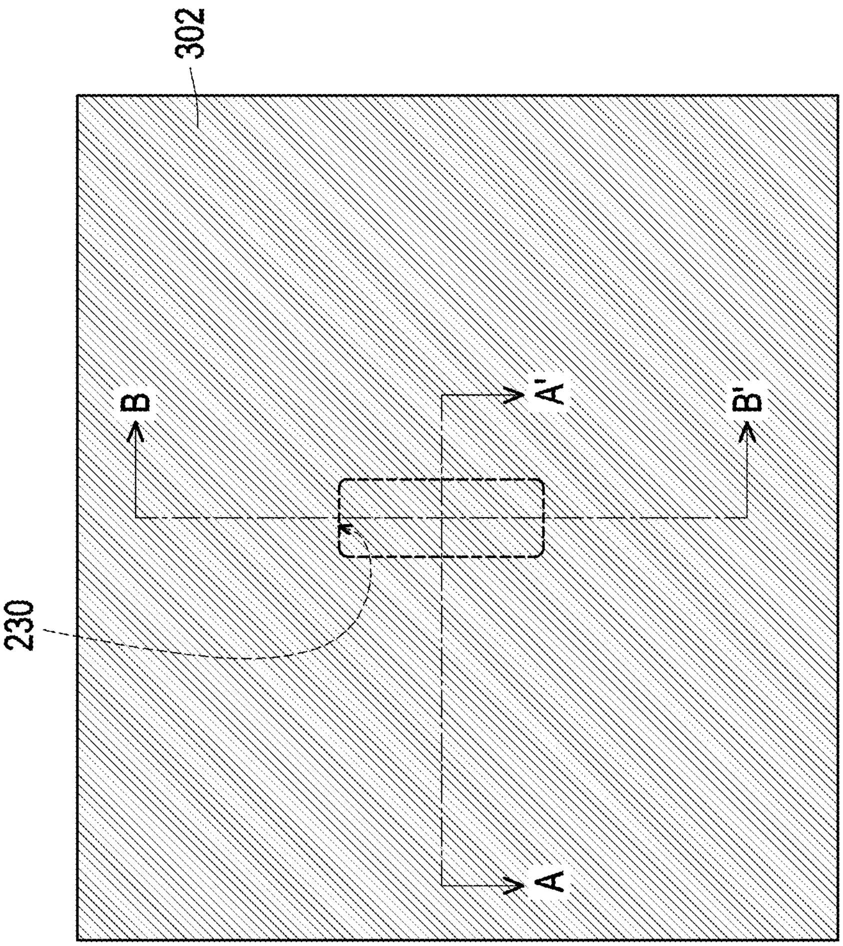
FIG. 4A to FIG. 4E are simplified top views illustrating various stages of a method of manufacturing a semiconductor structure in accordance with some alternative embodiments of the disclosure.
Figure 5A:
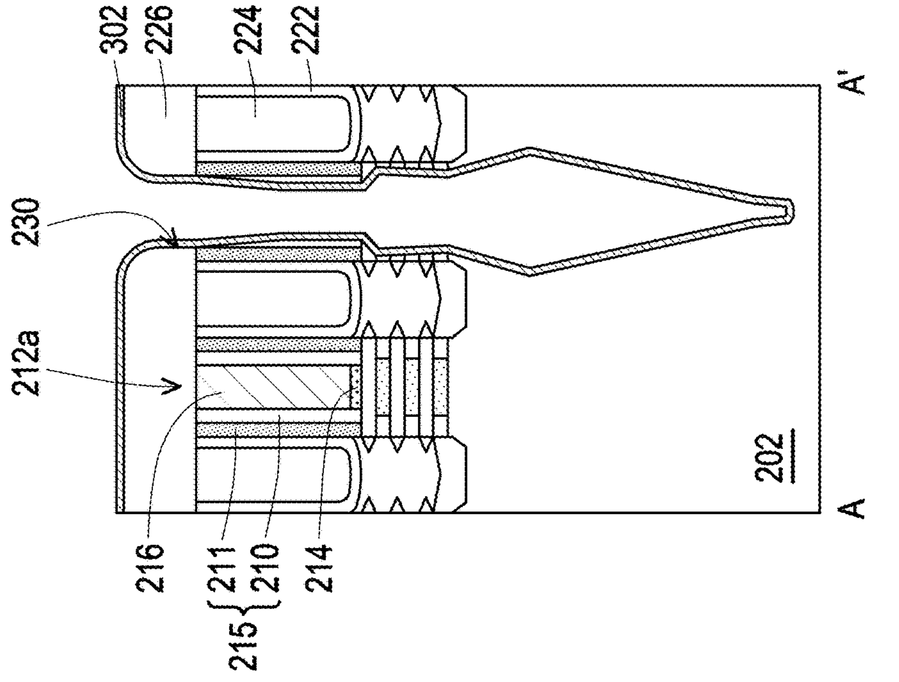
FIG. 5A to FIG. 5E are cross-sectional views illustrating various stages of the method of manufacturing the semiconductor structure in FIG. 4A to FIG. 4E.
Figure 6A:
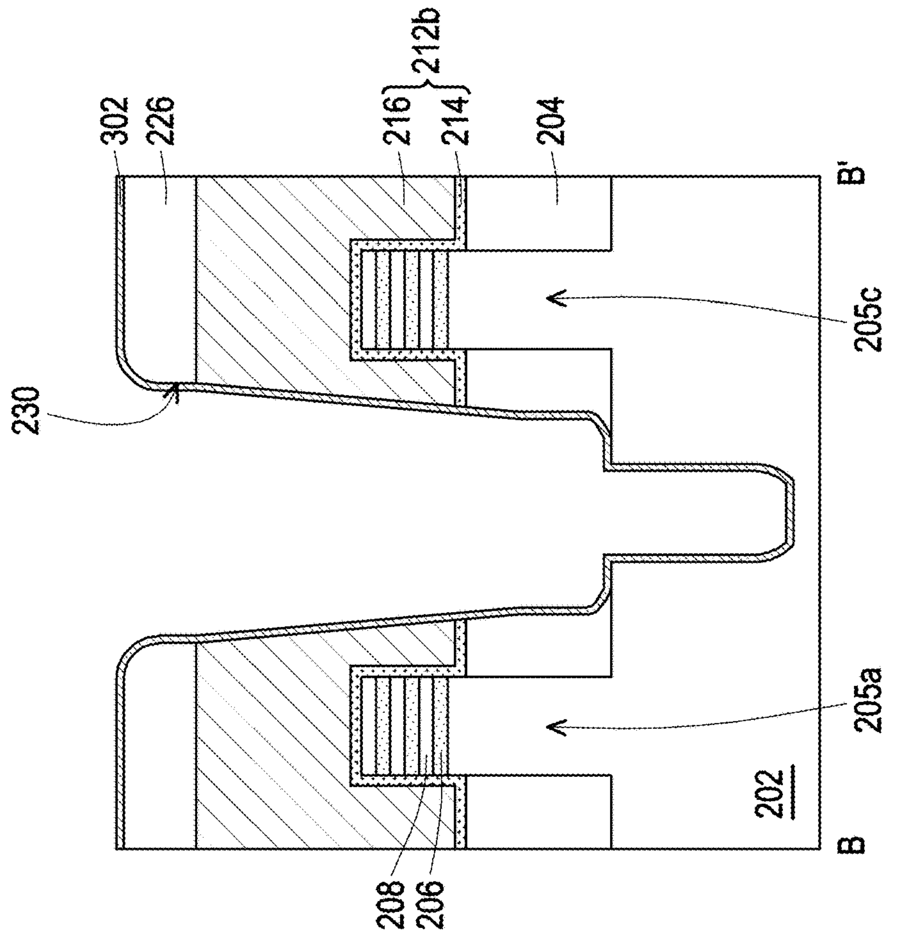
FIG. 6A to FIG. 6E are cross-sectional views illustrating various stages of the method of manufacturing the semiconductor structure in FIG. 4A to FIG. 4E.

Referring to FIG. 4A, FIG. 5A, and FIG. 6A, the structures in these figures are the same as the structure shown in FIG. 1D, FIG. 2D, and FIG. 3D. In other words, the structures shown in FIG. 4A, FIG. 5A, and FIG. 6A may be obtained by performing the steps shown in FIG. 1A to FIG. 1D, FIG. 2A to FIG. 2D, and FIG. 3A to FIG. 3D. However, the dielectric material layer 236 in FIG. 1D, FIG. 2D, and FIG. 3D is replaced by a dielectric material layer 302 in FIG. 4A, FIG. 5A, and FIG. 6A. In some embodiments, the dielectric material layer 302 is conformally formed over the dummy gate structures 212 and the hard mask layer 226. The dielectric material layer 302 is also conformally formed in the opening 230. For example, the dielectric material layer 302 entirely covers sidewalls and a bottom surface of the opening 230. In some embodiments, the dielectric material layer 302 is conformally deposited to have a generally uniform thickness. The dielectric material layer 302 may be formed by performing a deposition process such as a CVD process, a PVD process, an ALD process, or other suitable deposition process.

In some embodiments, the dielectric material layer 302 includes a high-k oxide dielectric material. In some embodiments, the high-k oxide dielectric material has a dielectric constant of 9 or more. For example, the high-k oxide dielectric material includes $Al_2O_3$, $Y_2O_3$, $La_2O_3$, $Ta_2O_5$, $TiO_2$, $HfO_2$, or $ZrO_2$.

Figure 4B:
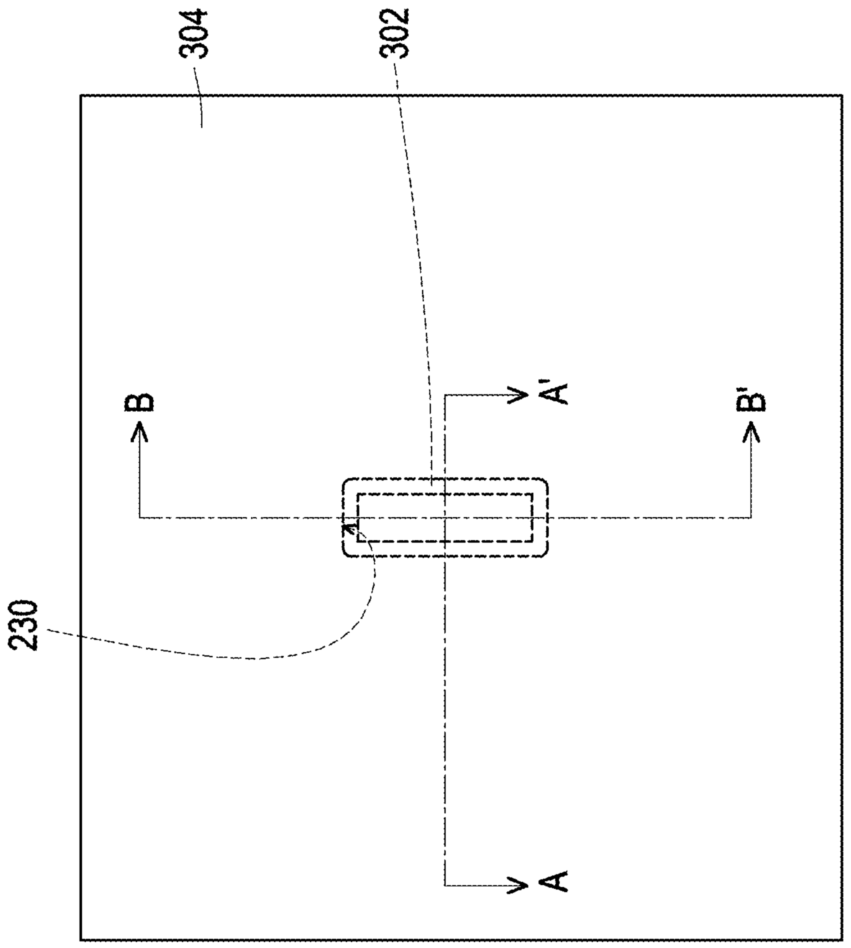
Figure 5B:
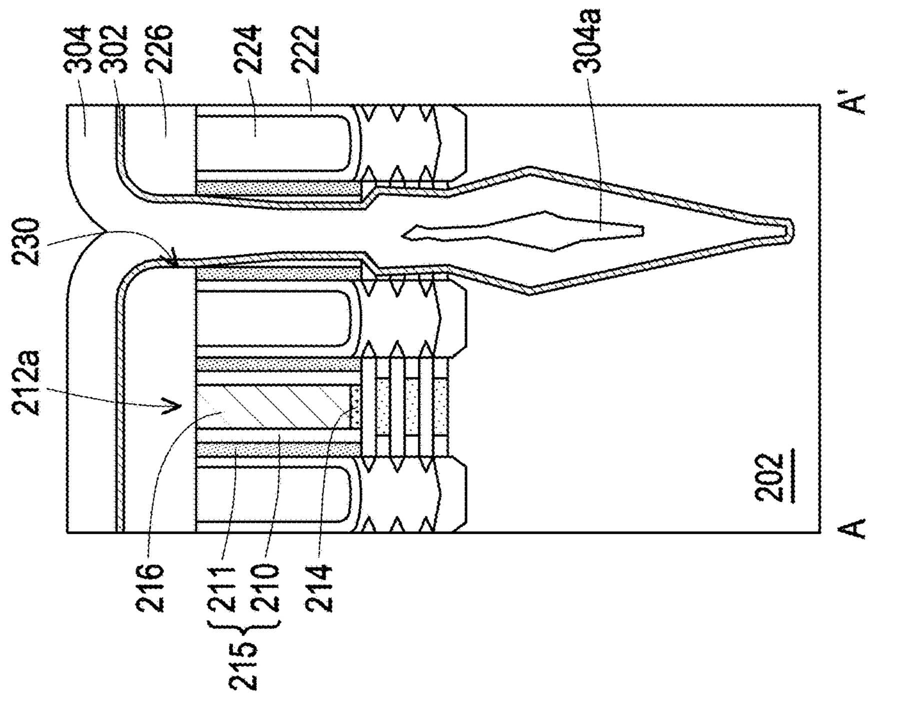
Figure 6B:
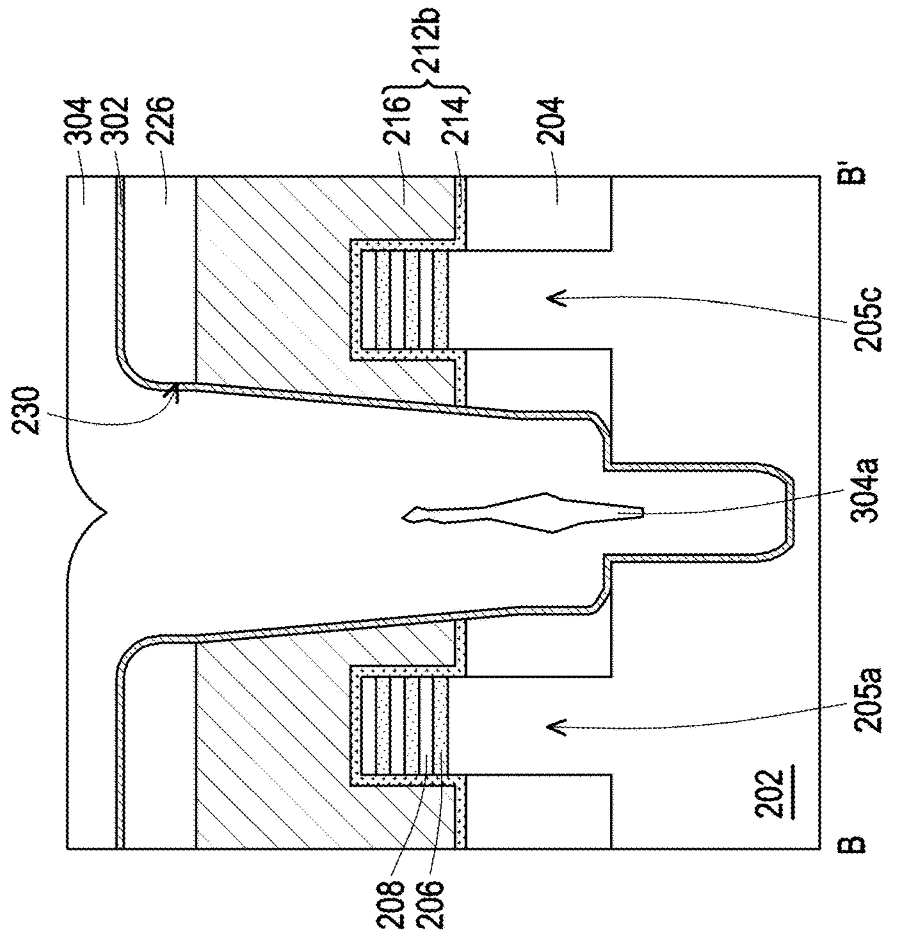

Referring to FIG. 4B, FIG. 5B, and FIG. 6B, a dielectric material layer 304 is deposited on the dielectric material layer 302 and in the opening 230. The deposition of the dielectric material layer 304 may include conformal deposition processes such as ALD (PEALD or thermal ALD), CVD, or the like. In some embodiments, a material of the dielectric material layer 302 and a material of the dielectric layer 304 are different. In some embodiments, the dielectric material layer 304 includes a nitride material. For example, the dielectric material layer 304 includes silicon nitride. As illustrated in FIG. 5B and FIG. 6B, a void 304*a* is formed in the dielectric material layer 304 due to the high aspect ratio of the opening 230. However, the disclosure is not limited thereto. In some alternative embodiments, the dielectric material layer 304 may be deposited without forming the void 304*a* therein.

Figure 4C:
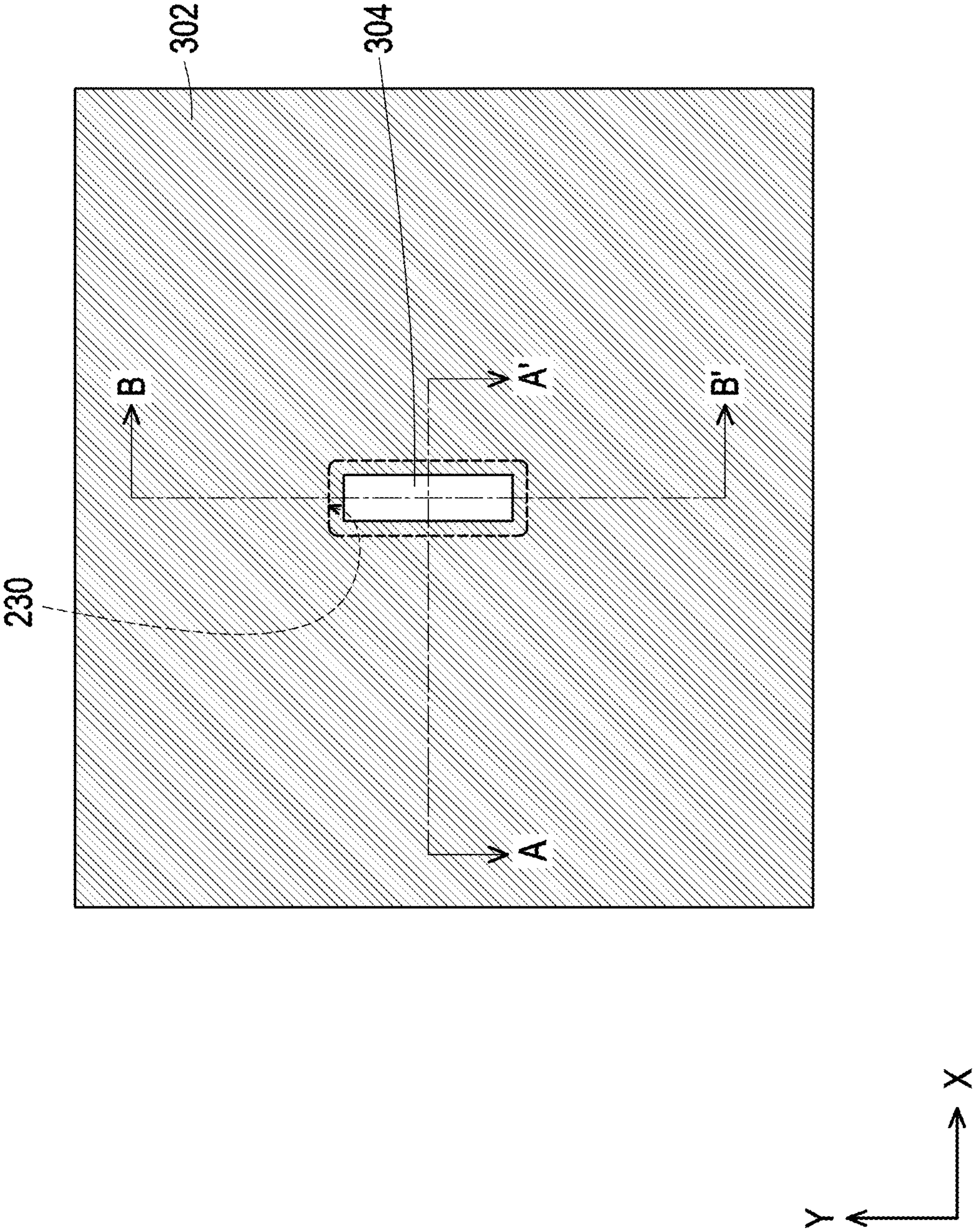
Figure 5C:
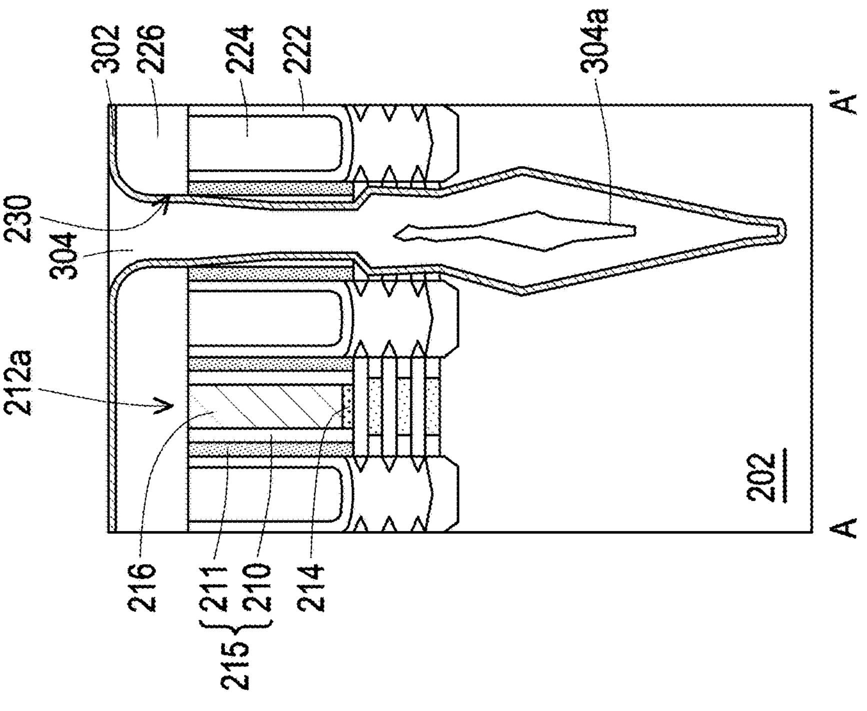
Figure 6C:
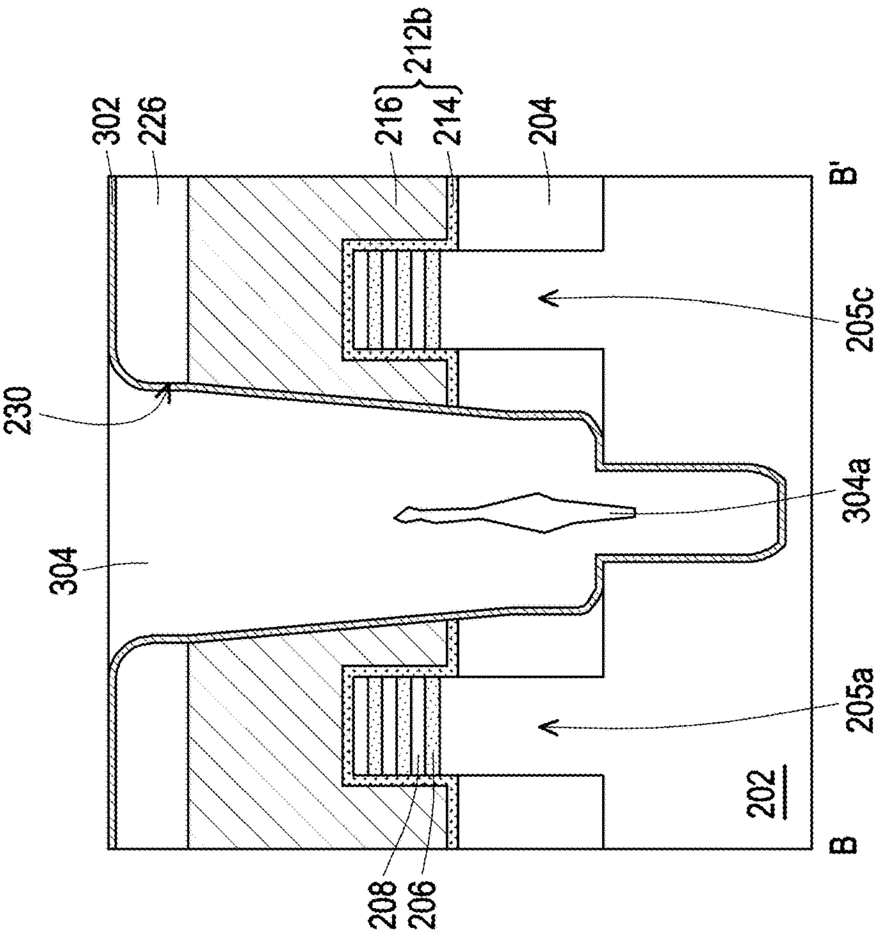

Referring to FIG. 4C, FIG. 5C, and FIG. 6C, a portion of the dielectric material layer 304 is removed. In some embodiments, the portion of the dielectric material layer 304 is removed through a planarization process (e.g., CMP). After the planarization process, a topmost surface of the dielectric material layer 302 is exposed.

Figure 4D:
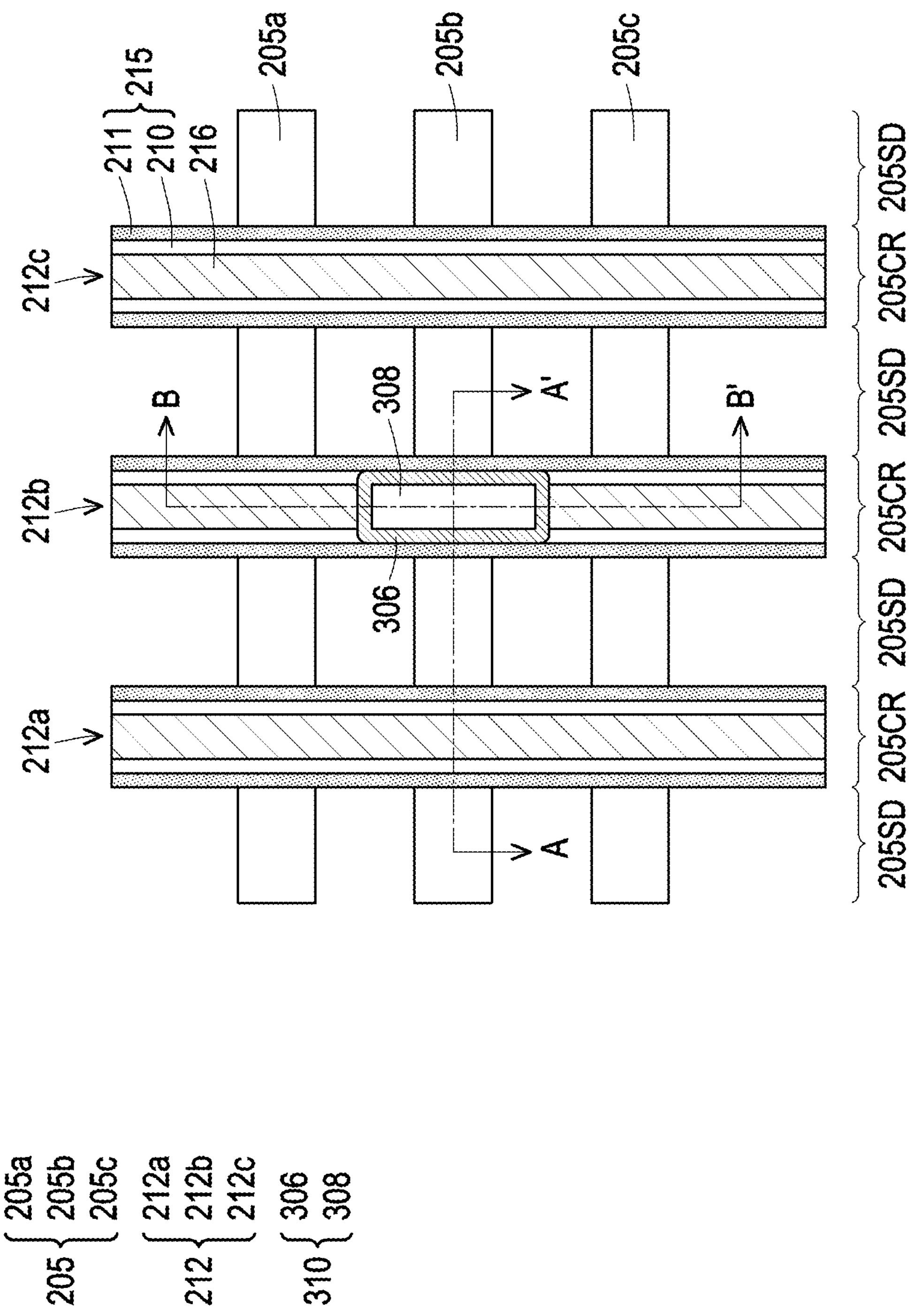
Figure 6D:
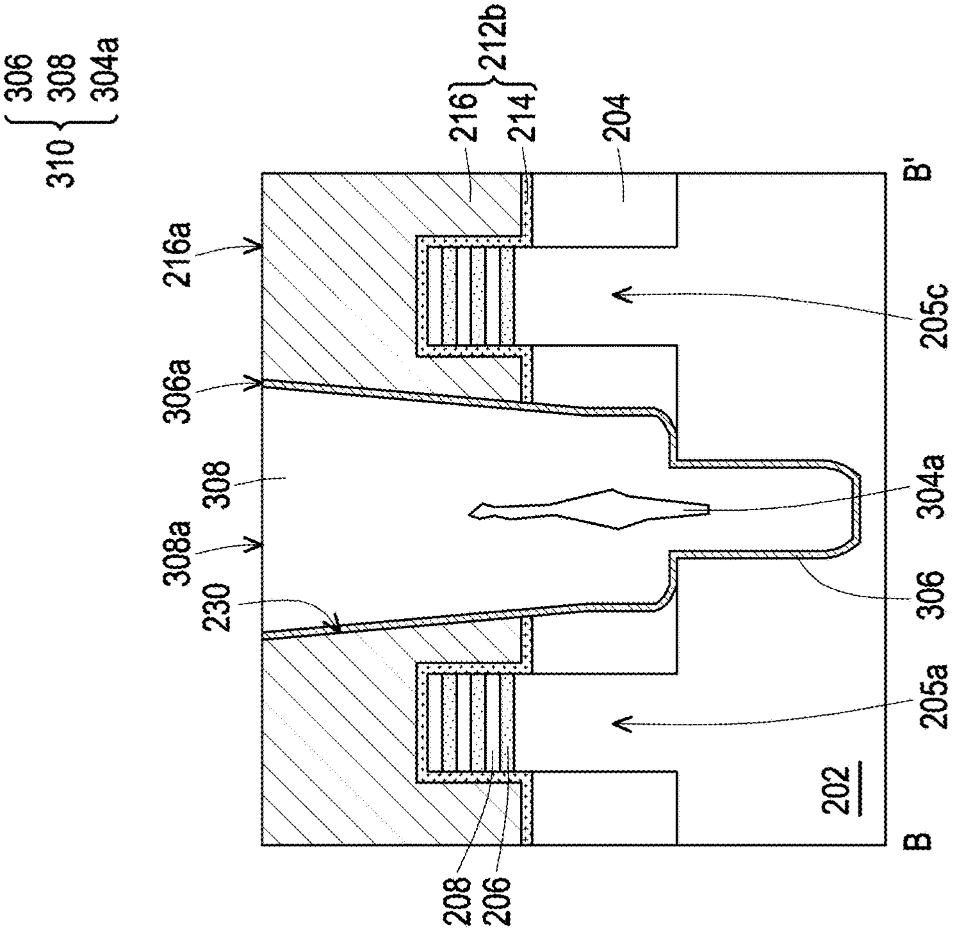
Figure 5D:
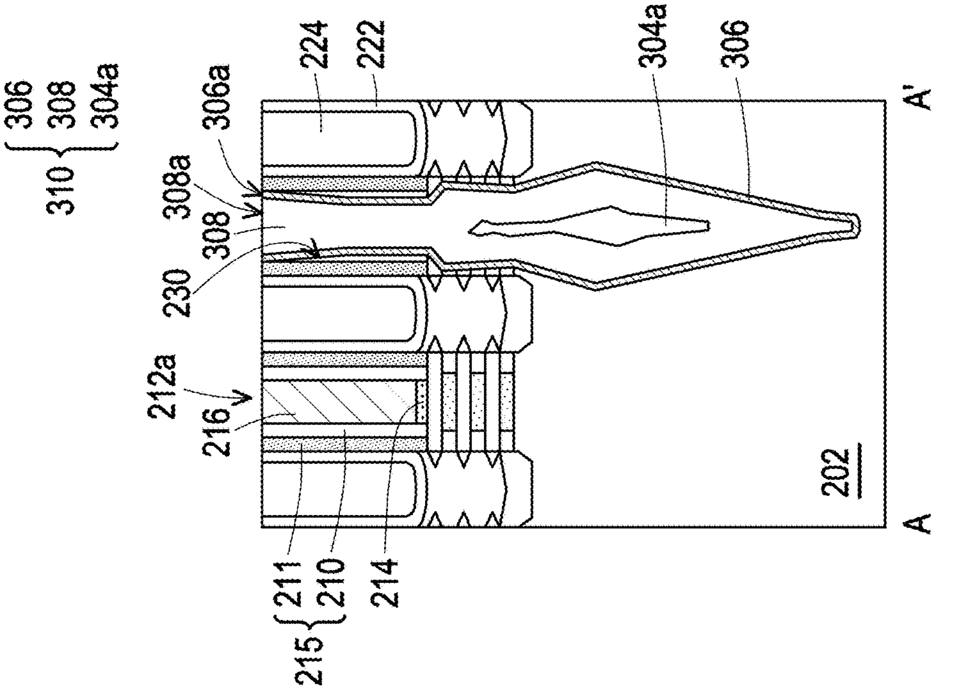

Referring to FIG. 4D, FIG. 5D, and FIG. 6D, the hard mask layer 226, a portion of the dielectric material layer 302, and a portion of the remaining dielectric material layer 304 are removed to form a dielectric layer 306 and a dielectric layer 308. In some embodiments, the hard mask layer 226, the portion of the dielectric material layer 302, and the portion of the remaining dielectric material layer 304 are removed through a planarization process (e.g., CMP) and/or an etching process (e.g., a dry etching process, a wet etching process, other suitable processes, or combinations thereof). After the planarization process and/or the etching process, top surfaces 216*a* of the dummy gate electrodes 216 and a top surface 306*a* of the dielectric layer 306 are exposed. Meanwhile, the dielectric layer 306, the dielectric layer 308, and the void 304*a* collectively fills up the opening 230. As illustrated in FIG. 6D, the dielectric layer 306 wraps around the dielectric layer 308. For example, the dielectric layer 306 covers sidewalls and a bottom surface of the dielectric layer 308.

As illustrated in FIG. 5D and FIG. 6D, the dielectric layer 308 encloses the void 304*a*. In some embodiments, the dielectric layer 306, the dielectric layer 308, and the void 304*a* are collectively referred to as a composite isolation structure 310. In some embodiments, the composite isolation structure 310 may be referred to as a "CPODE structure" to electrically isolate adjacent devices.

As illustrated in FIG. 6D, the top surface 216*a* of the dummy gate electrode 216 is coplanar with a top surface 306*a* of the dielectric layer 306 and a top surface 308*a* of the dielectric layer 308. Moreover, as illustrated in FIG. 5D, the top surface 306*a* of the dielectric layer 306 and the top surface 308*a* of the dielectric layer 308 are also coplanar with a top surface of the CESL 222, a top surface of the ILD layer 224, and top surfaces of the spacers 215.

Figure 4E:
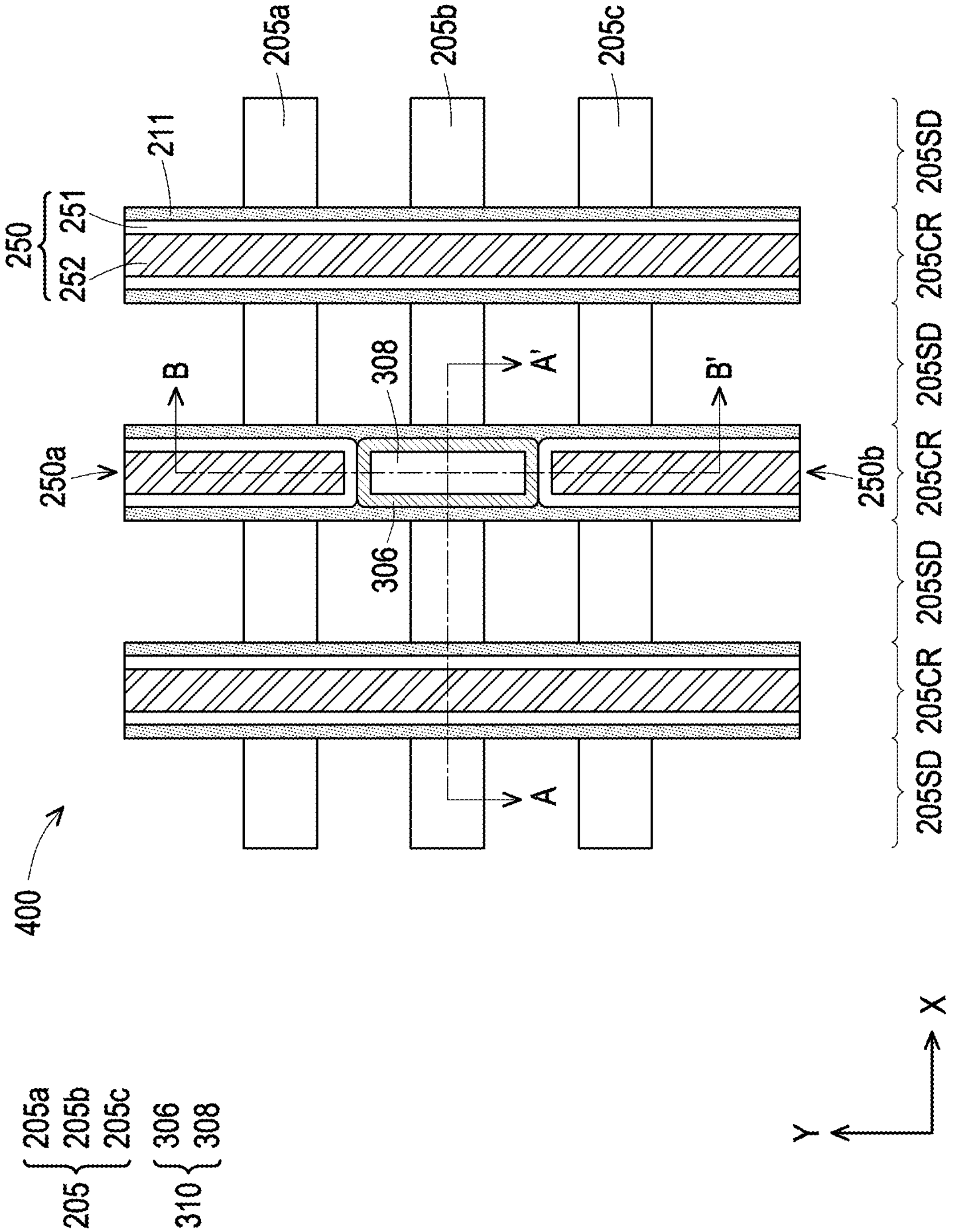
Figure 6E:
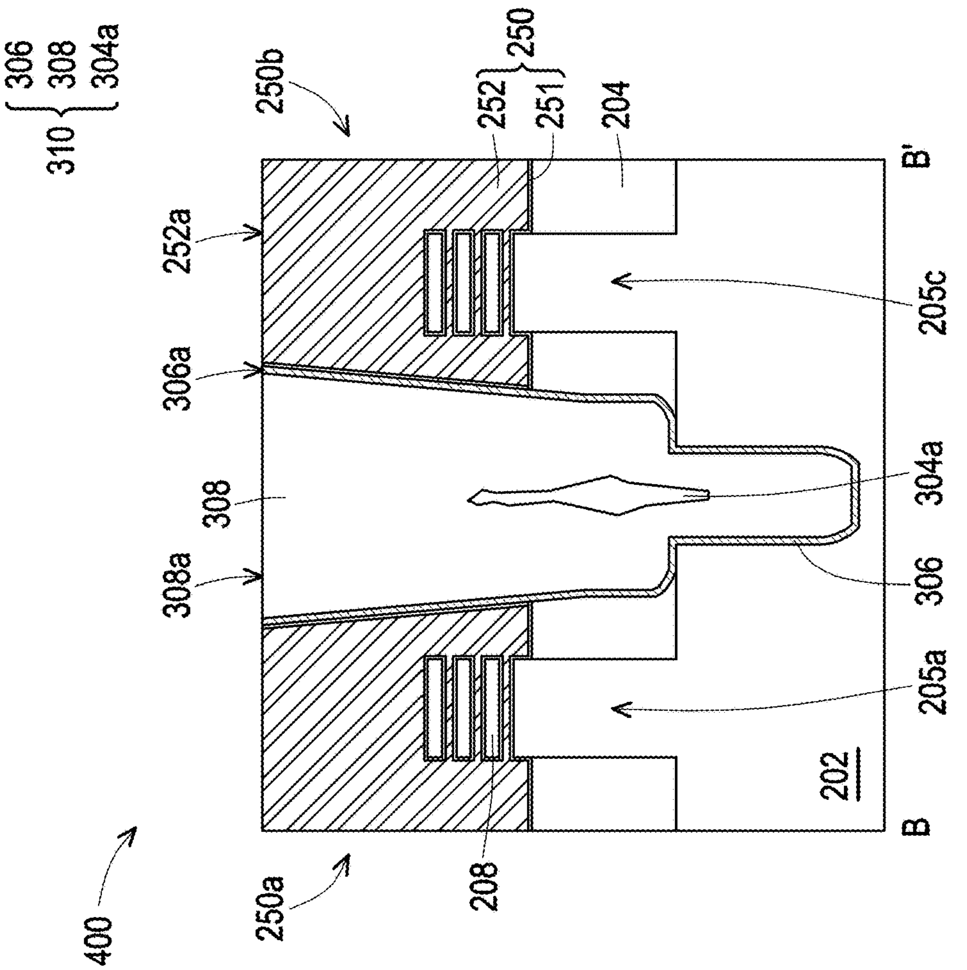
Figure 5E:
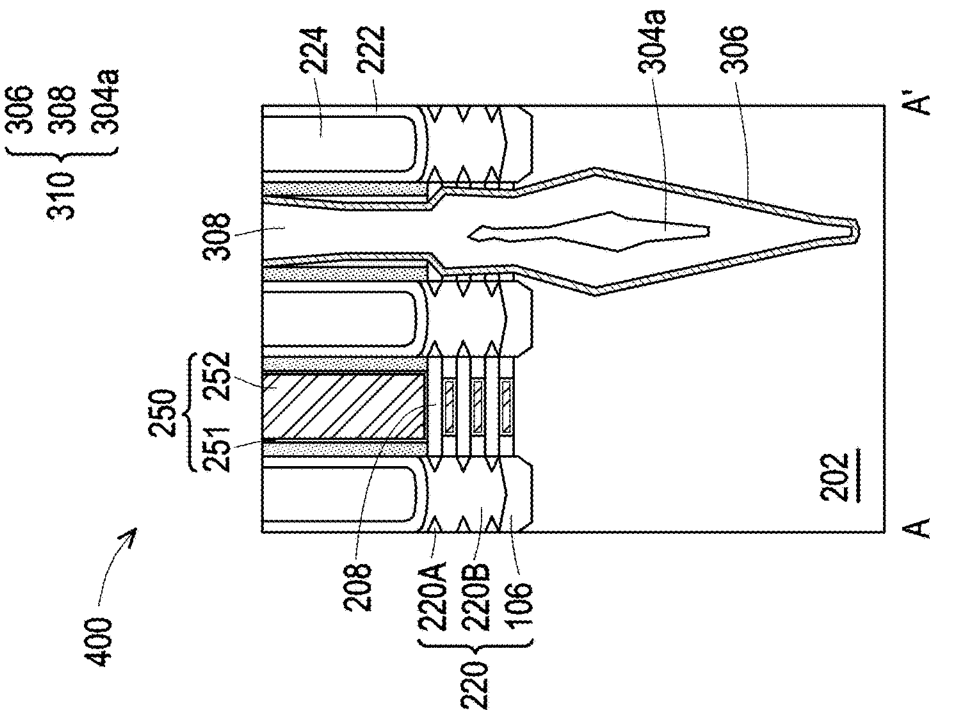

Referring to FIG. 4E, FIG. 5E, and FIG. 6E, the dummy gate electrode 216, the dielectric layer 214, and the first spacers 210 of the dummy gate structures 212 are removed. As illustrated in FIG. 4E, FIG. 5E, and FIG. 6E, the second spacers 211 are not removed. However, the disclosure is not limited thereto. In some alternative embodiments, the second spacers 211 may also be removed. In some embodiments, the removal of the dummy gate structures 212 results in gate trenches (not shown) over the channel regions 205CR. The removal of the dummy gate structures 212 may include one or more etching processes that are selective to the material of the dummy gate electrode 216, the dielectric layer 214, and the first spacers 210. For example, the removal of the dummy gate structures 212 may be performed using as a selective wet etch, a selective dry etch, or a combination thereof. After the removal of the dummy gate structures 212, the sacrificial layers 206 and the channel layers 208 are exposed. Thereafter, the sacrificial layers 206 between the channel layers 208 in the channel regions 205CR are removed. The selective removal of the sacrificial layers 206 allows the channel layers 208 to form channels between the source/drain features 220. In some embodiments, the channel layers 208 may be referred to as nanosheets. In other words, the channel regions 205CR includes nanosheets. The selective removal of the sacrificial layers 206 may be implemented by selective dry etch, selective wet etch, or other selective etch processes.

Subsequently, a plurality of gate structures 250 are formed in the gate trenches and are formed around the channel layers 208 to obtain a semiconductor device 400. For example, the gate structures 250 are formed within the gate trenches and are deposited in the space created by the removal of the sacrificial layers 206 in the channel regions 205CR. That is, the gate structures 250 wrap around the channel layers 208 (i.e., the nanosheets of the channel regions 205CR). In some embodiments, each gate structure 250 includes a gate dielectric layer 251 and a gate electrode 252 on the gate dielectric layer 251. In some embodiments, the material and the formation method of the gate dielectric layer 251 and the gate electrode 252 in FIG. 5E and FIG. 6E are respectively similar to that of the gate dielectric layer 251 and the gate electrode 252 in FIG. 2K and FIG. 3K, so the detailed descriptions thereof are omitted herein. As illustrated in FIG. 6E, top surfaces 252*a* of the gate structures 250 are coplanar with the top surface 306*a* of the dielectric layer 306 and the top surface 308*a* of the dielectric layer 308.

As illustrated in FIG. 4A to FIG. 4E, FIG. 5A to FIG. 5E, and FIG. 6A to FIG. 6E, the composite isolation structure 310 is disposed at location that is originally occupied by the dummy gate structure 212*b* before the partial removal of the dummy gate structure 212*b*. As illustrated in FIG. 4E, at least one of the gate structure 250 is divided into a first gate structure 250*a* and a second gate structure 250*b*. After the dummy gate structures 212 are replaced by the gate structures 250, the first gate structure 250*a* and the second gate structure 250*b* are formed on two opposite sides of the composite isolation structure 310, as shown in FIG. 4E and FIG. 6E. In some embodiments, the first gate structure 250*a* is disposed on the fin structure 205*a* while the second gate structure 250*b* is disposed on the fin structure 205*c*. In some embodiment, the first gate structure 250*a*, the channel layers 208 of the fin structure 205*a* surrounded by the first gate structure 250*a*, and the source/drain features 220 aside the first gate structure 250*a* may be collectively referred as a first device. The second gate structure 250*b*, the channel layers 208 of the fin structure 205*c* surrounded by the second gate structure 250*b*, and the source/drain features 220 aside the second gate structure 250*b* may be collectively referred as a second device. As illustrated in FIG. 6E, the dielectric layer 306 is located between the first gate structure 250*a* and the dielectric layer 308. Similarly, the dielectric layer 306 is also located between the second gate structure 250*b* and the dielectric layer 308. As mentioned above, since the first gate structure 250*a* wraps around the channel layers 208 in the channel regions 205CR of the fin structure 205*a*, the first device may be referred to as a gate-all-around (GAA) transistor. Similarly, since the second gate structure 250*b* wraps around the channel layers 208 in the channel regions 205CR of the fin structure 205*c*, the second device may be also be referred to as a GAA transistor.

As illustrated in FIG. 4E and FIG. 6E, since the composite isolation structure 310 is disposed between the first device and the second device, the composite isolation structure 310 is able to avoid electrical shorting and improve density of device, such that the separation distance between adjacent devices may be reduced or minimized. Moreover, since the dielectric constant of the dielectric layer 306 is 9 or more, the current leakage caused by low dielectric constant may be sufficiently alleviated, thereby improving the performance of the semiconductor device 400.

In accordance with some embodiments of the disclosure, a semiconductor device includes a semiconductor substrate, a first device, a second device, and a composite isolation structure. The first device includes a first fin structure and a first gate structure. The first fin structure is disposed over the semiconductor substrate and includes a first channel region. The first gate structure wraps around the first channel region. The second device includes a second fin structure and a second gate structure. The second fin structure is disposed over the semiconductor substrate and includes a second channel region. The second gate structure wraps around the second channel region. The composite isolation structure is disposed between the first device and the second device. The composite isolation structure includes a first dielectric layer and a second dielectric layer sandwiched between the semiconductor substrate and the first dielectric layer. A topmost surface of the second dielectric layer is lower than a bottom surface of the first channel region.

In accordance with some alternative embodiments of the disclosure, a semiconductor device includes a first device, a second device, and a composite isolation structure. The first device includes a first channel region and a first gate structure wrapping around the first channel region. The second device includes a second channel region and a second gate structure wrapping around the second channel region. The composite isolation structure is disposed between the first device and the second device. The composite isolation structure includes a first dielectric layer and a second dielectric layer wrapping around the first dielectric layer. The second dielectric layer includes a high-k oxide material.

In accordance with some embodiments of the disclosure, a manufacturing method of a semiconductor device includes at least the following steps. A semiconductor substrate having fin structures thereon is provided. Each fin structure includes a channel region. A dummy gate structure is formed across the fin structures. A portion of the dummy gate structure, the fin structure directly underneath the portion of the dummy gate structure, and a portion of the semiconductor substrate are removed to form a first opening. A composite isolation structure is formed in the first opening. The method of forming the composite isolation structure includes at least the following steps. A first dielectric layer partially covering sidewalls of the first opening is formed. A topmost surface of the first dielectric layer is lower than bottom surfaces of the channel regions. A second dielectric layer is formed on the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
- a semiconductor substrate;
- a first device, comprising:
  - a first fin structure disposed over the semiconductor substrate, wherein the first fin structure comprises a first channel region; and
  - a first gate structure wrapping around the first channel region;
- a second device, comprising:
  - a second fin structure disposed over the semiconductor substrate, wherein the second fin structure comprises a second channel region; and
  - a second gate structure wrapping around the second channel region;
- a shallow trench isolation (STI) region between the first fin structure and the second fin structure;
- a composite isolation structure separating the first gate structure and the second gate structure, comprising:
  - a first dielectric layer;
  - a second dielectric layer sandwiched between the semiconductor substrate and the first dielectric layer, wherein a topmost surface of the second dielectric layer is lower than a bottom surface of the first channel region; and
  - wherein the composite isolation structure extends into the semiconductor substrate below the STI region forming a step structure at a bottom surface of the STI region including a larger width at the bottom surface of the STI region than in the semiconductor substrate.

2. The semiconductor device of claim 1, wherein the topmost surface of the second dielectric layer is lower than a top surface of the STI region.

3. The semiconductor device of claim 1, wherein the first channel region comprises first nanosheets, and the second channel region comprises second nanosheets.

4. The semiconductor device of claim 1, wherein the isolation structure further comprises a void, and the first dielectric layer encloses the void.

5. The semiconductor device of claim 1, wherein the first dielectric layer has a first portion and a second portion stacked on the first portion, and the first portion is surrounded by the second dielectric layer.

6. The semiconductor device of claim 5, wherein the second portion of the first dielectric layer covers the topmost surface of the second dielectric layer.

7. The semiconductor device of claim 1, wherein a material of the first dielectric layer and a material of the second dielectric layer are different.

8. The semiconductor device of claim 1, wherein the first dielectric layer comprises a nitride material and the second dielectric layer comprises an oxide material.

9. A semiconductor device, comprising:

a semiconductor substrate;

a first device, comprising:

a first channel region over the semiconductor substrate; and a first gate structure wrapping around the first channel region;

a second device, comprising:

a second channel region over the semiconductor substrate; and a second gate structure wrapping around the second channel region;

a shallow trench isolation (STI) region between the first channel region and the second channel region;

a composite isolation structure separating the first gate structure and the second gate structure, comprising:

a first dielectric layer;

a second dielectric layer wrapping around the first dielectric layer, wherein the second dielectric layer comprises a high-k oxide material; and wherein the composite isolation structure extends into the semiconductor substrate below the STI region forming a step structure at a bottom surface of the STI region including a larger width at the bottom surface of the STI region than in the semiconductor substrate.

10. The semiconductor structure of claim 9, wherein a dielectric constant of the high-k oxide material is 9 or more.

11. The semiconductor device of claim 9, wherein the high-k oxide material comprises $Al_2O_3$, $Y_2O_3$, $La_2O_3$, $Ta_2O_5$, $TiO_2$, $HfO_2$, or $ZrO_2$.

12. The semiconductor device of claim 9, wherein the first dielectric layer comprises a nitride material.

13. The semiconductor device of claim 9, wherein the composite isolation structure further comprises a void, and the first dielectric layer encloses the void.

14. The semiconductor device of claim 9, wherein the first channel region and the second channel region respectively comprises nanosheets.

15. The semiconductor device of claim 9, wherein the second dielectric layer is located between the first gate structure and the first dielectric layer.

16. A manufacturing method of a semiconductor device, comprising:

providing a semiconductor substrate having fin structures thereon, wherein each fin structure comprises a channel region;

forming a shallow trench isolation (STI) region between the fin structures;

forming a dummy gate structure across the fin structures;

removing a portion of the dummy gate structure, the fin structure directly underneath the portion of the dummy gate structure, and a portion of the semiconductor substrate to form a first opening; and forming a composite isolation structure in the first opening, comprising:

forming a first dielectric layer partially covering sidewalls of the first opening, wherein a topmost surface of the first dielectric layer is lower than bottom surfaces of the channel regions;

forming a second dielectric layer on the first dielectric layer; and wherein the composite isolation structure extends into the semiconductor substrate below the STI region forming a step structure at a bottom surface of the STI region including a larger width at the bottom surface of the STI region than in the semiconductor substrate.

17. The method of claim 16, wherein forming the first dielectric layer comprises:

conformally forming a first dielectric material layer over the dummy gate structure and in the first opening, wherein the first dielectric material layer entirely covers the sidewalls of the first opening;

forming a sacrificial material layer on the first dielectric material layer to fill up the first opening;

removing a portion of the sacrificial material layer to expose an upper portion of the first dielectric material layer, wherein a top surface of a remaining portion of the sacrificial material layer is lower than the bottom surfaces of the channel regions;

removing the upper portion of the first dielectric material layer to form the first dielectric layer; and removing the remaining portion of the sacrificial material layer.

18. The method of claim 16, wherein forming the composite isolation structure further comprises:

forming a void enclosed by the second dielectric layer.

19. The method of claim 16, further comprising:

after the composite isolation structure is formed, removing a remaining portion of the dummy gate structure to form a second opening; and forming a gate structure in the second opening to wrap around the channel regions.

20. The method of claim 16, wherein the second dielectric layer is formed to cover the topmost surface of the first dielectric layer.

* * * * *